(12) United States Patent
Park et al.

(10) Patent No.: US 8,947,914 B2
(45) Date of Patent: *Feb. 3, 2015

(54) MAGNETIC TUNNELING JUNCTION DEVICES, MEMORIES, ELECTRONIC SYSTEMS, AND MEMORY SYSTEMS, AND METHODS OF FABRICATING THE SAME

(75) Inventors: Jeong Heon Park, Gyeonggi-do (KR); Woo Chang Lim, Gyeonggi-do (KR); Sechung Oh, Gyeonggi-do (KR); Woojin Kim, Gyeonggi-do (KR); Sang Hwan Park, Gyeonggi-do (KR); Jang Eun Lee, Gyeonggi-co (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 317 days.

This patent is subject to a terminal disclaimer.

(21) Appl. No.: 13/398,617

(22) Filed: Feb. 16, 2012

(65) Prior Publication Data

US 2012/0236631 A1 Sep. 20, 2012

(30) Foreign Application Priority Data

Mar. 18, 2011 (KR) .......................... 10-2011-0024429
Jul. 27, 2011 (KR) .......................... 10-2011-0074500

(51) Int. Cl.
*G11C 11/00* (2006.01)
*G11C 11/16* (2006.01)
*H01L 43/08* (2006.01)
*H01L 43/10* (2006.01)
(Continued)

(52) U.S. Cl.
CPC ............... *G11C 11/16* (2013.01); *H01L 43/08* (2013.01); *H01L 43/10* (2013.01); *H01L 43/12* (2013.01); *H01L 27/222* (2013.01); *Y10S 977/933* (2013.01); *Y10S 977/935* (2013.01)
USPC ........... 365/158; 365/148; 365/171; 977/933; 977/935

(58) Field of Classification Search
CPC ....................................... G11C 11/00
USPC .................. 257/295, 421, 422, 427, E21.665, 257/E27.006; 365/48, 55, 62, 66, 74, 78, 365/80–93, 100, 130, 131, 148, 158, 365/171–173, 209, 213, 225.5, 230.07, 232, 365/243.5; 977/933–935
See application file for complete search history.

(56) References Cited

U.S. PATENT DOCUMENTS 6,992,359 B2   1/2006   Nguyen et al.
7,045,841 B2   5/2006   Hong et al.
(Continued)

FOREIGN PATENT DOCUMENTS

JP   2005-203422 A   7/2005
JP   2005-303205 A   10/2005
(Continued)

*Primary Examiner* — Harry W Byrne
(74) *Attorney, Agent, or Firm* — Harness, Dickey & Pierce, P.L.C.

(57) ABSTRACT

Provided is a magnetic tunneling junction device including a fixed magnetic structure; a free magnetic structure; and a tunnel barrier between the fixed magnetic structure and the free magnetic structure, at least one of the fixed magnetic structure and the free magnetic structure including a perpendicular magnetization preserving layer, a magnetic layer between the perpendicular magnetization preserving layer and the tunnel barrier, and a perpendicular magnetization inducing layer between the perpendicular magnetization preserving layer and the magnetic layer.

16 Claims, 27 Drawing Sheets

(51) Int. Cl.
*H01L 43/12* (2006.01)
*H01L 27/22* (2006.01)

(56) References Cited

U.S. PATENT DOCUMENTS

| | | | |
|---|---|---|---|
| 7,777,261 B2 | 8/2010 | Huai et al. | |
| 7,939,870 B2* | 5/2011 | Wunderlich et al. | 257/295 |
| 8,508,006 B2* | 8/2013 | Jan et al. | 257/421 |
| 2005/0152075 A1 | 7/2005 | Miyazawa et al. | |
| 2005/0226052 A1 | 10/2005 | Horng et al. | |
| 2005/0231854 A1 | 10/2005 | Kawai | |
| 2007/0063237 A1 | 3/2007 | Huai et al. | |
| 2010/0072524 A1 | 3/2010 | Huai et al. | |
| 2012/0063035 A1* | 3/2012 | Childress et al. | 360/319 |
| 2012/0112298 A1* | 5/2012 | Kim et al. | 257/421 |
| 2012/0155164 A1* | 6/2012 | Shukh | 365/171 |
| 2012/0236631 A1* | 9/2012 | Park et al. | 365/158 |
| 2012/0280338 A1* | 11/2012 | Abraham et al. | 257/421 |
| 2013/0029182 A1* | 1/2013 | Zhang et al. | 428/811.1 |
| 2013/0215672 A1* | 8/2013 | Zhou et al. | 365/158 |
| 2013/0258763 A1* | 10/2013 | Ranjan et al. | 365/158 |

FOREIGN PATENT DOCUMENTS

| | | |
|---|---|---|
| JP | 2005-303302 A | 10/2005 |
| JP | 2007-525847 A | 9/2007 |
| JP | 2008-041716 A | 2/2008 |
| JP | 2009-509357 A | 3/2009 |
| KR | 2005-0100562 A | 10/2005 |
| KR | 10-0783307 B1 | 12/2007 |
| KR | 2008-0070812 A | 7/2008 |
| KR | 10-0856185 B1 | 9/2008 |

* cited by examiner

Fig. 13

| Element No. | Position | Function | Origin of Perpendicularity | Drawings |
|---|---|---|---|---|
| 201 | First Structure (41) | Free | Extrinsic | Fig.14 |
| 202 | First Structure (41) | Pinned | Extrinsic | Fig.15 |
| 203 | First Structure (41) | Free | Intrinsic | Fig.16 |
| 204 | First Structure (41) | Pinned | Intrinsic | Fig.17 |
| 301 | Second Structure (42) | Free | Extrinsic | Fig.18 |
| 302 | Second Structure (42) | Pinned | Extrinsic | Fig.19 |
| 303 | Second Structure (42) | Free | Intrinsic | Fig.20 |
| 304 | Second Structure (42) | Pinned | Intrinsic | Fig.21 |

Fig. 22

| Magnetic Tunnel Junction of Type 1 (MTJ1) | | | | |
|---|---|---|---|---|
| First Structure (41) | | Second Structure (42) | | Drawings |
| Pinned | | Free | | |
| 202 | Extrinsic | 301 | Extrinsic | Fig.23 |
| | | 303 | Intrinsic | Fig.24 |
| 204 | Intrinsic | 301 | Extrinsic | Fig.25 |
| | | 303 | Intrinsic | |

Fig. 26

| Magnetic Tunnel Junction of Type 2 (MTJ2) | | | | Drawings |
|---|---|---|---|---|
| First Structure (41) | | Second Structure (42) | | |
| Free | | Pinned | | |
| 201 | Extrinsic | 302 | Extrinsic | Fig.27 |
| | | 304 | Intrinsic | Fig.28 |
| 203 | Intrinsic | 302 | Extrinsic | Fig.29 |
| | | 304 | Intrinsic | |

MAGNETIC TUNNELING JUNCTION DEVICES, MEMORIES, ELECTRONIC SYSTEMS, AND MEMORY SYSTEMS, AND METHODS OF FABRICATING THE SAME

CROSS-REFERENCE TO RELATED APPLICATIONS

This U.S. non-provisional patent application claims priority under 35 U.S.C. §119 to Korean Patent Application Nos. 10-2011-0024429 and 10-2011-0074500, filed on Mar. 18, 2011 and Jul. 27, 2011, respectively, in the Korean Intellectual Property Office, the entire contents of which are hereby incorporated by reference.

BACKGROUND

Embodiments of inventive concepts relate generally to semiconductor memory devices. For example, embodiments of inventive concepts relate to semiconductor memory devices including magnetic tunneling junction (MTJ) devices, memories, electronic systems, and memory systems and methods of fabricating the same.

With increasing use of portable computing devices and wireless communication devices, memory devices may require higher density, lower power, and/or nonvolatile properties. Magnetic memory devices may be able to satisfy the aforementioned technical requirements.

An example data storing mechanism for a magnetic memory device is a tunnel magneto resistance (TMR) effect of an MTJ. For example, a magnetic memory device with an MTJ have been developed such that an MTJ may have a TMR ratio of several hundred to several thousand percent. However, as pattern dimensions are reduced, it may become more difficult to provide a thermally stable MTJ.

SUMMARY

Example embodiments of inventive concepts provide magnetic memory devices having improved thermal stability.

Other example embodiments of inventive concepts provide methods of fabricating a magnetic memory device having improved thermal stability.

According to example embodiments of inventive concepts, a magnetic tunneling junction device may include a fixed magnetic structure; a free magnetic structure; and a tunnel barrier between the fixed magnetic structure and the free magnetic structure, at least one of the fixed magnetic structure and the free magnetic structure including a perpendicular magnetization preserving layer, a magnetic layer between the perpendicular magnetization preserving layer and the tunnel barrier, and a perpendicular magnetization inducing layer between the perpendicular magnetization preserving layer and the magnetic layer.

In example embodiments, the magnetic layer is made of a ferromagnetic material.

In example embodiments, the ferromagnetic material is at least one of CoFeB, CoFe, NiFe, CoFePt, CoFePd, CoFeCr, CoFeTb, CoFeGd or CoFeNi.

In example embodiments, the magnetic layer has a thickness in a range of about 1 angstrom to about 30 angstroms.

In example embodiments, the magnetic layer has a thickness in a range of about 3 angstroms to about 17 angstroms.

In example embodiments, the perpendicular magnetization inducing layer is in direct contact with the magnetic layer.

In example embodiments, the perpendicular magnetization inducing layer includes at least one of Ta, Ti, U, Ba, Zr, Al, Sr, Hf, La, Ce, Sm, Mg, Th, Ca, Sc, or Y.

In example embodiments, the perpendicular magnetization inducing layer has an electrical resistivity higher than the magnetic layer or the perpendicular magnetization preserving layer.

In example embodiments, the perpendicular magnetization inducing layer has a thickness less than the magnetic layer or the perpendicular magnetization preserving layer.

In example embodiments, the perpendicular magnetization preserving layer has an electrical resistivity lower than the perpendicular magnetization inducing layer.

In example embodiments, the perpendicular magnetization preserving layer is formed of at least one noble metal or copper.

In example embodiments, the at least one noble metal includes ruthenium (Ru), rhodium (Rh), palladium (Pd), silver (Ag), osmium (Os), iridium (Ir), platinum (Pt), or gold (Au).

In example embodiments, the magnetic tunneling junction device further includes a substrate; wherein the fixed magnetic structure is a lower structure closer to the substrate and the wherein the free magnetic structure is an upper structure further from the substrate.

In example embodiments, the magnetic tunneling junction device further includes a substrate; wherein the free magnetic structure is a lower structure closer to the substrate and the wherein the fixed magnetic structure is an upper structure further from the substrate.

According to example embodiments of inventive concepts, an electronic device may include a bus; a wireless interface configured to transmit data to or receive data from a wireless communication network connected to the bus; an I/O device connected to the bus; a controller connected to the bus; and a memory including a semiconductor device including a magnetic tunneling junction device, connected to the bus, configured to store a command code to be used by the controller or user data.

According to example embodiments of inventive concepts, a memory system may include a memory device including a semiconductor device including a magnetic tunneling junction device, for storing data; and a memory controller configured to control the memory device to read data stored in the memory device or to write data into the memory device in response to a read/write request of a host.

According to example embodiments of inventive concepts, a magnetic tunneling junction device may include a fixed magnetic structure; a free magnetic structure; and a tunnel barrier between the fixed magnetic structure and the free magnetic structure, at least one of the fixed magnetic structure and the free magnetic structure including a perpendicular magnetization preserving layer, a magnetic layer between the perpendicular magnetization preserving layer and the tunnel barrier, and a perpendicular magnetization inducing layer between the perpendicular magnetization preserving layer and the magnetic layer; wherein the magnetic layer has an oxygen affinity less than the perpendicular magnetization inducing layer.

In example embodiments, the perpendicular magnetization preserving layer has an oxygen affinity less than the perpendicular magnetization inducing layer.

In example embodiments, the perpendicular magnetization inducing layer is an oxygen-containing material.

In example embodiments, the perpendicular magnetization inducing layer is a metal oxide.

In example embodiments, the metal oxide is at least one of magnesium oxide, tantalum oxide, titanium oxide, aluminum oxide, magnesium zinc oxide, hafnium oxide, or magnesium boron oxide.

In example embodiments, the perpendicular magnetization preserving layer is formed of at least one of material having an electrical resistivity lower than tantalum or titanium.

According to example embodiments of inventive concepts, a magnetic tunneling junction device may include a first structure including a pinned layer; a second structure including a free layer; and a tunnel barrier between the first and second structures, the second structure including a magnetic layer; a perpendicular magnetization inducing layer on the magnetic layer, a perpendicular magnetization preserving layer on the perpendicular magnetization inducing layer, a capping layer on the perpendicular magnetization preserving layer.

In example embodiments, the magnetic layer has an oxygen affinity less than the perpendicular magnetization inducing layer.

In example embodiments, the perpendicular magnetization preserving layer has an oxygen affinity less than the perpendicular magnetization inducing layer.

In example embodiments, the perpendicular magnetization inducing layer is an oxygen-containing material.

In example embodiments, the perpendicular magnetization inducing layer is a metal oxide.

In example embodiments, the metal oxide is at least one of magnesium oxide, tantalum oxide, titanium oxide, aluminum oxide, magnesium zinc oxide, hafnium oxide, or magnesium boron oxide.

In example embodiments, the perpendicular magnetization inducing layer has a thickness less than the magnetic layer or the perpendicular magnetization preserving layer.

According to example embodiments of inventive concepts, a method of fabricating a magnetic device may include forming a magnetic layer; forming a perpendicular magnetization inducing layer on the magnetic layer; forming a perpendicular magnetization preserving layer on the perpendicular magnetization inducing layer; oxidizing the perpendicular magnetization preserving layer; and annealing the oxidized perpendicular magnetization preserving layer to diffuse oxygen from the perpendicular magnetization preserving layer to the perpendicular magnetization inducing layer.

In example embodiments, the method further includes forming a capping layer on the oxidized perpendicular magnetization preserving layer.

In example embodiments, oxidizing the perpendicular magnetization preserving layer includes supplying a gas containing oxygen at a temperature of a 0-500° C.

In example embodiments, the gas containing oxygen further includes ozone.

In example embodiments, oxidizing the perpendicular magnetization preserving layer includes forming a stoichiometric oxide layer.

In example embodiments, oxidizing the perpendicular magnetization preserving layer includes nonhomogeneously distributing oxygen atoms in the perpendicular magnetization preserving layer.

In example embodiments, annealing the oxidized perpendicular magnetization preserving layer includes a thermal treatment including supplying at least one of nitrogen or an inert gas as an ambient gas.

In example embodiments, the magnetic layer has an oxygen affinity less than the perpendicular magnetization inducing layer.

In example embodiments, the perpendicular magnetization preserving layer has an oxygen affinity less than the perpendicular magnetization inducing layer.

In example embodiments, the magnetic layer is made of a ferromagnetic material.

In example embodiments, the ferromagnetic material is at least one of CoFeB, CoFe, NiFe, CoFePt, CoFePd, CoFeCr, CoFeTb, CoFeGd or CoFeNi.

In example embodiments, the magnetic layer has a thickness in a range of about 1 angstrom to about 30 angstroms.

In example embodiments, the magnetic layer has a thickness in a range of about 3 angstroms to about 17 angstroms In example embodiments, the perpendicular magnetization inducing layer is in direct contact with the magnetic layer.

In example embodiments, the perpendicular magnetization inducing layer is an oxygen-containing material.

In example embodiments, the perpendicular magnetization inducing layer is a metal oxide.

In example embodiments, the metal oxide is at least one of magnesium oxide, tantalum oxide, titanium oxide, aluminum oxide, magnesium zinc oxide, hafnium oxide, or magnesium boron oxide.

In example embodiments, the perpendicular magnetization inducing layer includes at least one of Ta, Ti, U, Ba, Zr, Al, Sr, Hf, La, Ce, Sm, Mg, Th, Ca, Sc, or Y.

In example embodiments, the perpendicular magnetization inducing layer has an electrical resistivity higher than the magnetic layer or the perpendicular magnetization preserving layer.

In example embodiments, the perpendicular magnetization inducing layer has a thickness less than the magnetic layer or the perpendicular magnetization preserving layer.

In example embodiments, the perpendicular magnetization preserving layer has an electrical resistivity lower than the perpendicular magnetization inducing layer.

In example embodiments, the perpendicular magnetization preserving layer is formed of at least one noble metal or copper.

In example embodiments, the at least one noble metal includes ruthenium (Ru), rhodium (Rh), palladium (Pd), silver (Ag), osmium (Os), iridium (Ir), platinum (Pt), or gold (Au).

In example embodiments, the perpendicular magnetization preserving layer is formed of at least one of material having an electrical resistivity lower than tantalum or titanium.

According to example embodiments of inventive concepts, a method of fabricating a magnetic device may include forming a seeding layer; forming a perpendicular magnetization preserving layer on the seeding layer; oxidizing the perpendicular magnetization preserving layer; forming a perpendicular magnetization inducing layer on the oxidized perpendicular magnetization preserving layer; forming a magnetic layer on the perpendicular magnetization inducing layer; and annealing the oxidized perpendicular magnetization preserving layer to diffuse oxygen from the perpendicular magnetization preserving layer to the perpendicular magnetization inducing layer.

In example embodiments, the magnetic layer has an oxygen affinity less than the perpendicular magnetization inducing layer.

In example embodiments, the perpendicular magnetization preserving layer has an oxygen affinity less than the perpendicular magnetization inducing layer.

In example embodiments, the magnetic layer is at least one of CoFeB, CoFe, NiFe, CoFePt, CoFePd, CoFeCr, CoFeTb, CoFeGd or CoFeNi.

In example embodiments, the perpendicular magnetization inducing layer is an oxygen-containing material.

In example embodiments, the perpendicular magnetization inducing layer is a metal oxide.

In example embodiments, the metal oxide is at least one of magnesium oxide, tantalum oxide, titanium oxide, aluminum oxide, magnesium zinc oxide, hafnium oxide, or magnesium boron oxide.

In example embodiments, the perpendicular magnetization inducing layer includes at least one of Ta, Ti, U, Ba, Zr, Al, Sr, Hf, La, Ce, Sm, Mg, Th, Ca, Sc, or Y.

In example embodiments, the perpendicular magnetization inducing layer has an electrical resistivity higher than the magnetic layer or the perpendicular magnetization preserving layer.

In example embodiments, the perpendicular magnetization preserving layer includes ruthenium (Ru), rhodium (Rh), palladium (Pd), silver (Ag), osmium (Os), iridium (Ir), platinum (Pt), or gold (Au).

In example embodiments, the perpendicular magnetization preserving layer is formed of at least one of material having an electrical resistivity lower than tantalum or titanium.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 13 is a table showing an exemplary classification of lower and upper structures according to example embodiments of inventive concepts;

FIG. 22 is a table showing an exemplary classification of the first type of MTJ according to example embodiments of inventive concepts;

FIG. 26 is a table showing an exemplary classification of the second type of MTJ according to example embodiments of inventive concepts;

Figure 1:
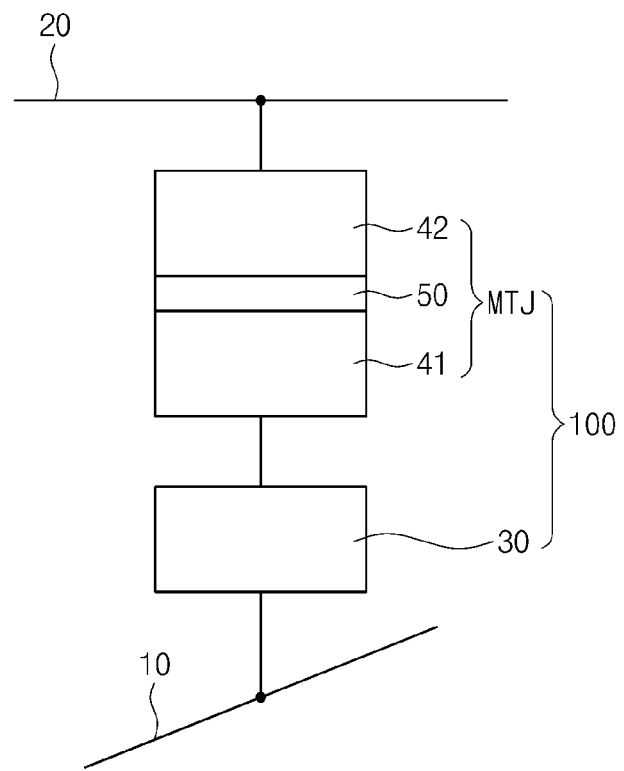
FIG. 1 is a schematic circuit diagram of a unit cell of a magnetic memory device according to example embodiments of inventive concepts.
Figure 2:
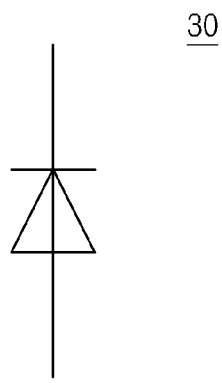
FIGS. 2 through 6 are circuit diagrams exemplarily illustrating selection devices according to example embodiments of inventive concepts.
Figure 3:
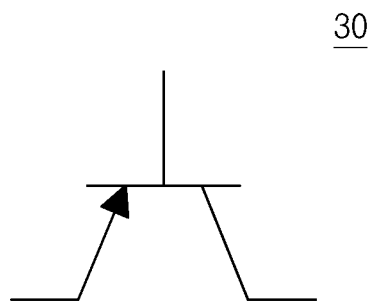
Figure 4:
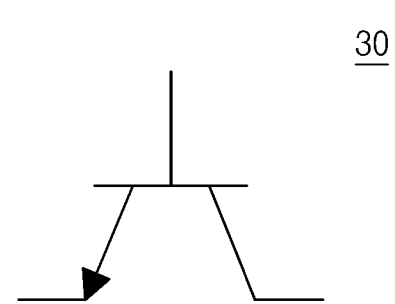
Figure 5:
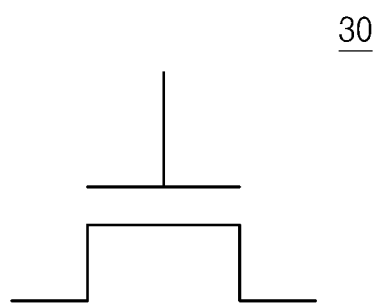
Figure 6:
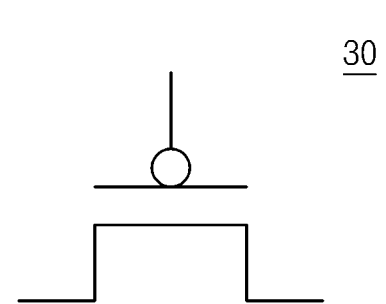

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to example embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram exemplarily illustrating a unit cell of magnetic memory devices according to example embodiments of inventive concepts.

Referring to FIG. 1, a unit cell 100 may be disposed between first and second interconnection lines 10 and 20 crossing each other. The unit cell 100 may be connected in series to the first and second interconnection lines 10 and 20. The unit cell 100 may include a selection element 30 and a magnetic tunnel junction MTJ. The selection element 30 and the magnetic tunnel junction MTJ may be electrically connected in series to each other. In some example embodiments, one of the first and second interconnection lines 10 and 20 may be used as a word line, and the other may be used as a bit line.

The selection element 30 may be configured to selectively control an electric current passing through the magnetic tunnel junction MTJ. For example, as shown in FIGS. 2 through 6, the selection element 30 may be one of a diode, a pnp bipolar transistor, an npn bipolar transistor, an NMOS field effect transistor (FET), and a PMOS FET. In the case that the selection element 30 is a three-terminal switching device, such as a bipolar transistor and/or MOSFET, an additional interconnection line (not shown) may be connected to the selection element 30.

The magnetic tunnel junction MTJ may include a lower structure 41, an upper structure 42, and a tunnel barrier 50 therebetween. Each of the lower and upper structures 41 and 42 may include at least one magnetic layer, which is formed of a magnetic material.

One of the magnetic layers may be configured to have a fixed magnetization direction, which is not changed by an external magnetic field generated under usual circumstances. Hereinafter, for convenience in description, a term 'pinned layer PL' will be used to represent the magnetic layer having the fixed magnetization property. By contrast, the other of the magnetic layers may be configured to have a magnetization direction being switchable by an external magnetic field applied thereto. Hereinafter, a term 'free layer FRL' will be used to represent the magnetic layer having the switchable magnetization property. That is, as shown in FIGS. 7 and 8, the magnetic tunnel junction MTJ may include at least one free layer FRL and at least one pinned layer PL, which are separated by the tunnel barrier 50.

Electrical resistance of the magnetic tunnel junction MTJ may be sensitive to a relative orientation of magnetization directions of the free and pinned layers FRL and PL. For example, the electrical resistance of the magnetic tunnel junction MTJ may be far greater when the relative orientation is antiparallel than when parallel. This means that the electrical resistance of the magnetic tunnel junction MTJ may be controlled by changing the magnetization direction of the free layer FRL. The magnetic memory devices according to example embodiments of inventive concepts may be realized based on this data storing mechanism.

Figure 7:
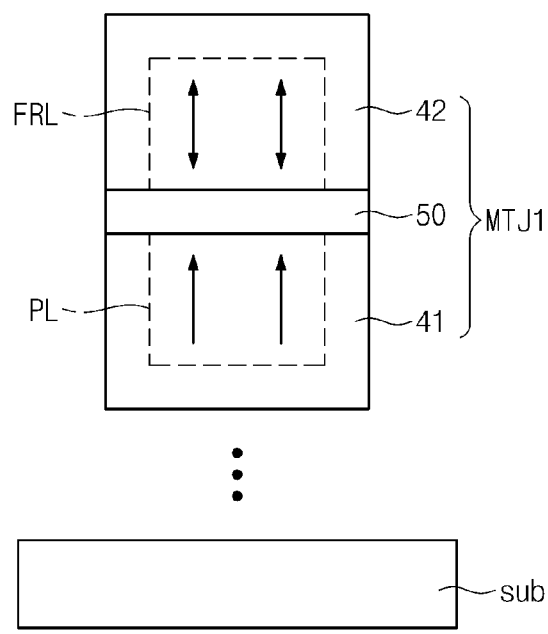
FIG. 7 is a diagram schematically illustrating a first type of MTJ according to example embodiments of inventive concepts.
Figure 8:
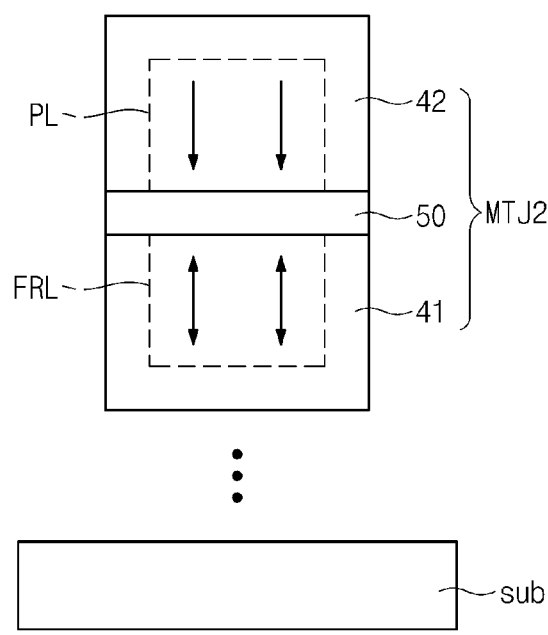
FIG. 8 is a diagram schematically illustrating a second type of MTJ according to example embodiments of inventive concepts.

As shown in FIGS. 7 and 8, the lower and upper structures 41 and 42 of the magnetic tunnel junction MTJ may be sequentially formed on a substrate SUB. In example embodiments, according to a relative configuration between the free layer FRL and the substrate SUB or a forming order of the free layer FRL and the pinned layer PL, the magnetic tunnel junction MTJ may be, for example, classified into two types:

(a) a first type of magnetic tunnel junction MTJ1 configured in such a way that the lower and upper structures 41 and 42 include the pinned layer PL and the free layer FRL, respectively, as shown in FIG. 7, and (b) a second type of magnetic tunnel junction MTJ2 configured in such a way that the lower and upper structures 41 and 42 include the free layer FRL and the pinned layer PL, respectively, as shown in FIG. 8.

Figure 9:
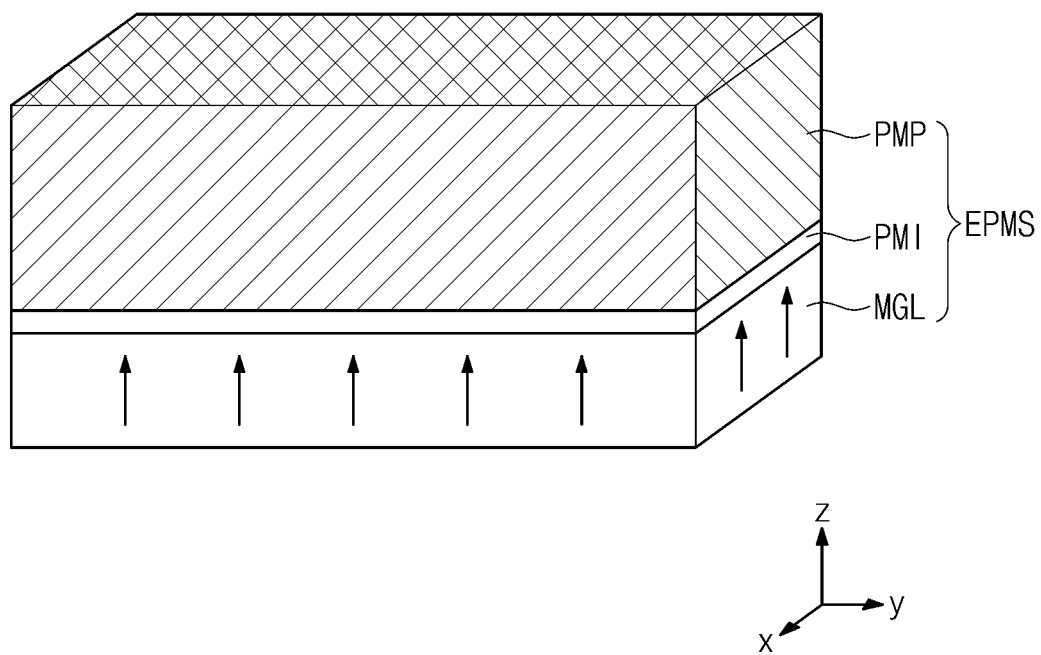
FIG. 9 is a perspective view exemplarily illustrating an extrinsic perpendicular magnetization structure according to example embodiments of inventive concepts.
Figure 10A:
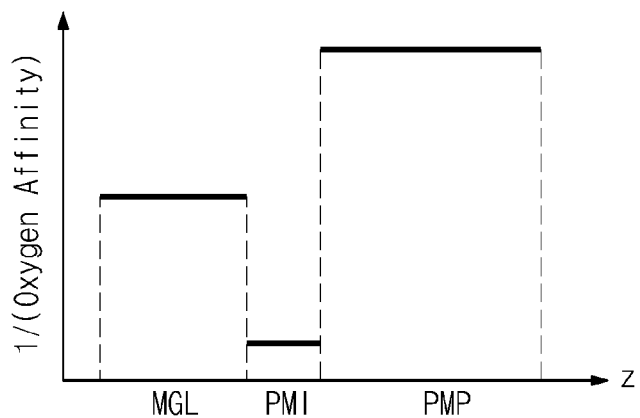
FIGS. 10A and 10B are graphs illustrating some aspects of the extrinsic perpendicular magnetization structure.
Figure 10B:
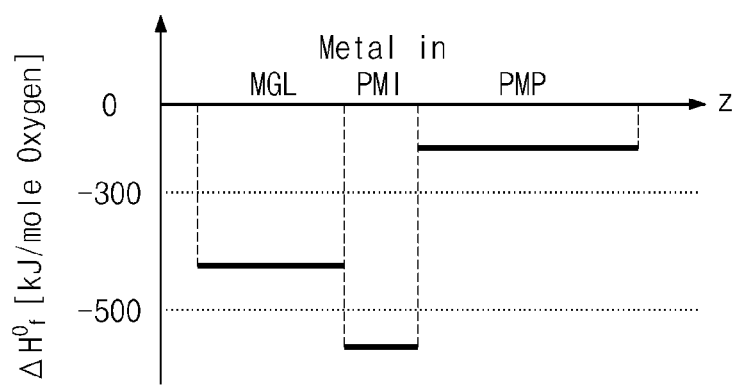

FIG. 9 is a perspective view exemplarily illustrating an extrinsic perpendicular magnetization structure, which may be provided as a part of a MTJ according to example embodiments of inventive concepts, and FIGS. 10A and 10B are graphs illustrating some aspects of the extrinsic perpendicular magnetization structure.

According to some aspects of inventive concepts, at least one of the lower structure 41 and the upper structure 42 may configure an extrinsic perpendicular magnetization structure EPMS. In some example embodiments, the extrinsic perpendicular magnetization structure EPMS may include a magnetic layer MGL, a perpendicular magnetization preserving layer PMP, and/or a perpendicular magnetization inducing layer PMI interposed between the magnetic layer MGL and the perpendicular magnetization preserving layer PMP, as shown in FIG. 9. The magnetic layer MGL of the extrinsic perpendicular magnetization structure EPMS may be used as the magnetic layer included in the lower structure 41 and the upper structure 42. In other words, the free or pinned layer FRL or PL may be the magnetic layer MGL of the extrinsic perpendicular magnetization structure EPMS.

The magnetic layer MGL may include a ferromagnetic material. For example, the magnetic layer MGL may be formed of at least one of CoFeB, CoFe, NiFe, CoFePt, CoFePd, CoFeCr, CoFeTb, CoFeGd or CoFeNi. In addition, the magnetic layer MGL may be provided in a form of thin pattern, whose vertical thickness is far smaller than horizontal lengths thereof. For example, a thickness of the magnetic layer MGL may be in a range of about 1 angstrom to about 30 angstroms. In more specific example embodiments, the thickness of the magnetic layer MGL may be in a range of about 3 angstroms to about 17 angstroms. In example embodiments, owing to magnetic anisotropy caused by the geometrical shape of the magnetic layer MGL, the magnetic layer MGL may have a magnetization direction confined to a plane (e.g., xy-plane) parallel to a top surface thereof. Hereinafter, this magnetic property of the magnetic layer MGL will be called 'intrinsic horizontal magnetization property'. That is, the magnetic layer MGL may be an intrinsic horizontal magnetic layer having the intrinsic horizontal magnetization property.

In modified example embodiments of inventive concepts, the magnetic layer MGL may be an intrinsic perpendicular magnetic (IPM) layer having an intrinsic perpendicular magnetization property. That is, the magnetic layer MGL may have a magnetization direction that is spontaneously oriented perpendicular to the xy-plane or the top surface thereof. For example, the magnetic layer MGL may include at least one of a) CoFeTb, in which the relative content of Tb is 10% or more, b) CoFeGd, in which the relative content of Gd is 10% or more, c) CoFeDy, d) FePt with the $L1_0$ structure, e) FePd with the $L1_0$ structure, f) CoPd with the $L1_0$ structure, g) CoPt with the $L1_0$ structure, h) CoPt with the hexagonal close packing (HCP) structure, i) alloys containing at least one of materials presented in items of a) to h), or j) a multi-layered structure including magnetic and non-magnetic layers alternatingly stacked. The multi-layered structure including the alternatingly-stacked magnetic and non-magnetic layers may include at least one of (Co/Pt)n, (CoFe/Pt)n, (CoFe/Pd)n, (CoP)n, (Co/Ni)n, (CoNi/Pt)n, (CoCr/Pt)n, or (CoCr/Pd)n, where the subscript n denotes the stacking number.

The perpendicular magnetization inducing layer PMI may be formed to be in direct contact with the magnetic layer MGL, and this directly contacting configuration enables to change a magnetization direction of the magnetic layer MGL from parallel to perpendicular to a top plane of the magnetic layer MGL. That is, the perpendicular magnetization inducing layer PMI may serve as an external factor for the magnetic layer MGL to have the perpendicular magnetization property. In this sense, the perpendicular magnetization inducing layer PMI and the magnetic layer MGL being in contact with each other may constitute a magnetic structure with an extrinsic perpendicular magnetization property (e.g., the extrinsic perpendicular magnetization structure). Hereinafter, the magnetic layer MGL in the extrinsic perpendicular magnetization structure may be called "an extrinsic perpendicular magnetic (EPM) layer".

The perpendicular magnetization inducing layer PMI may be an oxygen-containing material. In some example embodiments, the perpendicular magnetization inducing layer PMI may be at least one of metal oxides. For example, the perpendicular magnetization inducing layer PMI may be at least one of magnesium oxide, tantalum oxide, titanium oxide, aluminum oxide, magnesium zinc oxide, hafnium oxide, or magnesium boron oxide. In example embodiments, the perpendicular magnetization inducing layer PMI may have electrical resistivity higher than the magnetic layer MGL or the perpendicular magnetization preserving layer PMP. In example embodiments, an electric resistance of the magnetic tunnel junction MTJ may be strongly dependent on the electrical resistivity of the perpendicular magnetization inducing layer PMI. In order to reduce this dependency, the perpendicular magnetization inducing layer PMI may be formed to be thin. For example, the perpendicular magnetization inducing layer PMI may be formed to have a thickness less than the magnetic layer MGL or the perpendicular magnetization preserving layer PMP.

The perpendicular magnetization preserving layer PMP may be formed of a material having resistivity lower than the perpendicular magnetization inducing layer PMI. For example, the perpendicular magnetization preserving layer PMP may be formed of at least one of noble metals (such as, ruthenium (Ru), rhodium (Rh), palladium (Pd), silver (Ag), osmium (Os), iridium (Ir), platinum (Pt), or gold (Au)) or copper. According to some example embodiments of inventive concepts, the perpendicular magnetization preserving layer PMP may be formed of at least one of materials having resistivity lower than tantalum or titanium.

In addition, according to some aspects of inventive concepts, a portion of the perpendicular magnetization preserving layer PMP, which is in contact with the perpendicular magnetization inducing layer PMI, may be formed of a material hardly reacting with oxygen atoms. The noble metals or copper described above may be selected as a material satisfying this requirement for the perpendicular magnetization preserving layer PMP. In some example embodiments, the perpendicular magnetization preserving layer PMP may be formed of a material hardly reacting with oxygen atoms, even during subsequent process steps or under normal operating conditions.

For example, as shown in FIG. 10A, the perpendicular magnetization preserving layer PMP may be a material having an oxygen affinity less than metallic elements constituting the perpendicular magnetization inducing layer PMI. In example embodiments, the oxygen affinity may be represented by the standard enthalpy of reaction for the formation of metal oxide ($\Delta H^\circ_f$ [kJ/mole Oxygen]), as shown in FIG. 10B. In some example embodiments, the standard enthalpy of reaction $\Delta H^o_f$ of the metallic elements constituting the perpendicular magnetization inducing layer PMI may be less than about −500 [kJ/mole Oxygen], and the standard enthalpy of reaction $\Delta H^o_f$ of the perpendicular magnetization preserving layer PMP may be greater than −300 [kJ/mole Oxygen]. That is, the standard enthalpy of reaction may be greater for the metallic elements constituting the perpendicular magnetization inducing layer PMI than for the perpendicular magnetization preserving layer PMP, in terms of the absolute value. In some example embodiments, the metallic elements constituting the perpendicular magnetization inducing layer PMI may be at least one of Ta, Ti, U, Ba, Zr, Al, Sr, Hf, La, Ce, Sm, Mg, Th, Ca, Sc, or Y, and the perpendicular magnetization preserving layer PMP may include at least one of Au, Ag, Pt, Pd, Rh, Ru, Cu, Re, or Pb. As shown in FIG. 10A or 10B, the magnetic layer MGL may be formed of a material having an oxygen affinity less than the metallic elements constituting the perpendicular magnetization inducing layer PMI and greater than the perpendicular magnetization preserving layer PMP. In example embodiments, chemical reactivity with oxygen can be represented by various physical quantities. For example, physical quantities, such as an oxidation potential or a free energy in oxidation, can be used to quantitatively represent the chemical reactivity with oxygen, instead of the oxygen affinity or the standard enthalpy of reaction.

Figure 11:
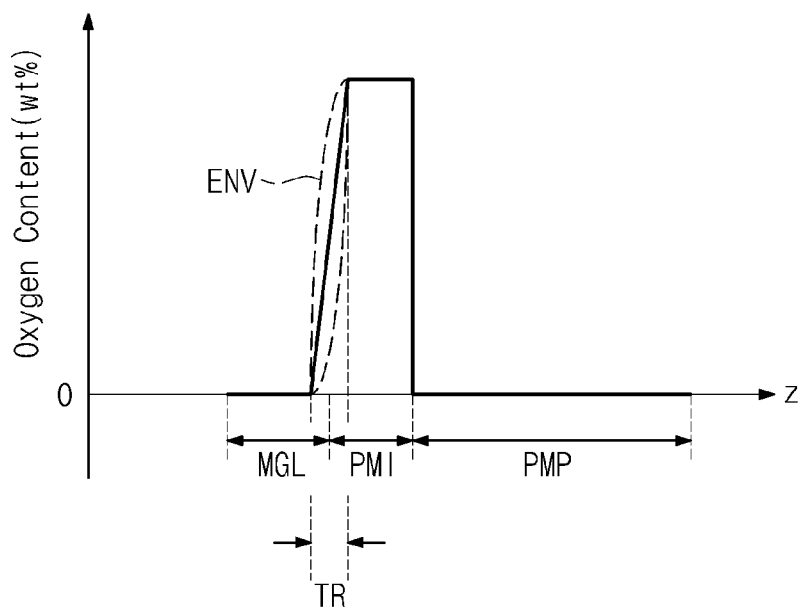
FIG. 11 is a graph illustrating other aspects of the extrinsic perpendicular magnetization structure.

FIG. 11 is a graph illustrating other aspects of the extrinsic perpendicular magnetization structure. Referring to FIG. 11, the extrinsic perpendicular magnetization property may result from a chemical combination of atoms in the magnetic layer MGL and oxygen atoms in the perpendicular magnetization inducing layer PMI. In example embodiments, as shown in FIG. 11, a transition region TR, whose oxygen content is higher than the magnetic layer MGL and lower than the perpendicular magnetization inducing layer PMI, may be formed between the magnetic layer MGL and the perpendicular magnetization inducing layer PMI. In some example embodiments, there is no reason that the oxygen content should be linear in the transition region TR. For example, in the transition region TR, the oxygen content may vary monotonically within a specific envelope ENV, as shown in FIG. 11.

Alternatively, the perpendicular magnetization preserving layer PMP may be formed of a material hardly reacting with oxygen atoms, even during subsequent processes or under normal operating conditions. In some example embodiments, as shown in FIG. 11, the perpendicular magnetization inducing layer PMI may be formed to have finite oxygen content, and the perpendicular magnetization preserving layer PMP may be formed to have a substantially infinitesimal oxygen content. In some example embodiments, the oxygen content may vary abruptly at an interface between the perpendicular magnetization inducing layer PMI and the perpendicular magnetization preserving layer PMP. That is, an absolute value of gradient of the oxygen content may be greater at the interface between the perpendicular magnetization inducing layer PMI and the perpendicular magnetization preserving layer PMP than at the transition region TR.

In other example embodiments, the transition region TR may be formed in the whole region of the perpendicular magnetization inducing layer PMI. For example, in the graph of FIG. 11, a z-directional gradient of oxygen content may have a finite non-vanishing value in the whole region of the perpendicular magnetization inducing layer PMI or between the magnetic layer MGL and the perpendicular magnetization preserving layer PMP. In some example embodiments, the oxygen content of the perpendicular magnetization inducing layer PMI may be greater at a region adjacent to the perpendicular magnetization preserving layer PMP than at other region adjacent to the magnetic layer MGL.

Figure 12:
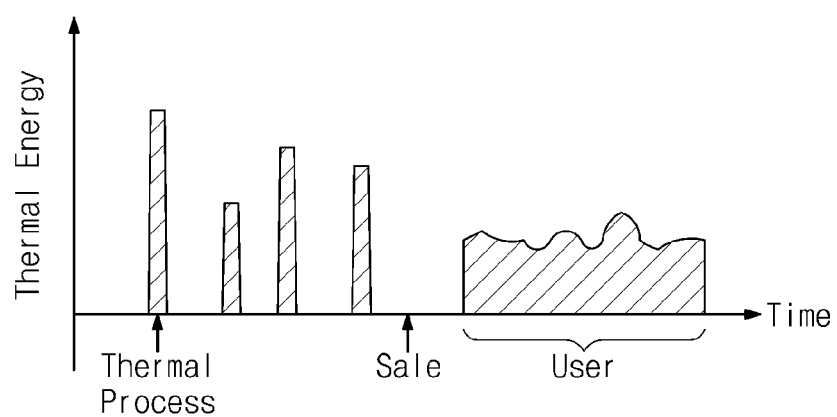
FIG. 12 is a graph illustrating still other aspects of the extrinsic perpendicular magnetization structure.

FIG. 12 is a graph illustrating still other aspects of an extrinsic perpendicular magnetization structure.

The formation of the magnetic memory device may further include process steps (for example, at least one thermal treatment step, a wiring step, and so forth), which will be performed after forming the perpendicular magnetization inducing layer PMI and the perpendicular magnetization preserving layer PMP. As shown in FIG. 12, an thermal energy, which may be generated during these subsequent process steps or by user's normal operation, may be supplied to the perpendicular magnetization inducing layer PMI. This thermal energy may dissociate oxygen atoms from the perpendicular magnetization inducing layer PMI.

However, in the case that the perpendicular magnetization preserving layer PMP having the low oxygen affinity is formed to cover the perpendicular magnetization inducing layer PMI, it is possible to prevent the dissociated oxygen atoms from diffusing away from the perpendicular magnetization inducing layer PMI. For instance, if the thermal energy is not supplied from outside the magnetic tunnel junction MTJ, the dissociated oxygen atoms may be restored to its chemically stable state. Here, in the case that, as the afore-described embodiments, the perpendicular magnetization preserving layer PMP is formed of a material having a low oxygen affinity, the dissociated oxygen atoms may be recombined with metal elements constituting the perpendicular magnetization inducing layer PMI, not the perpendicular magnetization preserving layer PMP. That is, the perpendicular magnetization inducing layer PMI may be restored to its original state before the supply of the thermal energy.

As described with reference to FIG. 1, each of the lower and upper structures 41 and 42 may include a magnetic layer, and according to its function the magnetic layer may be classified into the free layer FRL or the pinned layer PL, as described with reference to FIGS. 7 and 8. In addition, when an external inducing element (e.g., the perpendicular magnetization inducing layer PMI) is provided, the magnetic layer may serve as a part of the extrinsic perpendicular magnetization structure EPMS, as described with reference to FIG. 9.

In some example embodiments, the IPM layer having the afore-described intrinsic perpendicular magnetization property may be used as one of the magnetic layers included in the lower and upper structures 41 and 42. In other words, one of the magnetic layers included in the lower and upper structures 41 and 42 is configured to have the perpendicular magnetization property, even when there is no external inducing element, such as the perpendicular magnetization inducing layer PMI of the extrinsic perpendicular magnetization structure EPMS. For example, the IPM layer may include one of a) CoFeTb, in which the relative content of Tb is 10% or more, b) CoFeGd, in which the relative content of Gd is 10% or more, c) CoFeDy, d) FePt with the $L1_0$ structure, e) FePd with the $L1_0$ structure, f) CoPd with the $L1_0$ structure, g) CoPt with the $L1_0$ structure, h) CoPt with the hexagonal close packing (HCP) structure, i) alloys containing at least one of materials presented in items of a) to h), or j) a multi-layered structure including magnetic and non-magnetic layers alternatingly stacked. The multi-layered structure including the alternatingly-stacked magnetic and non-magnetic layers may include at least one of (Co/Pt)n, (CoFe/Pt)n, (CoFe/Pd)n, (CoP)n, (Co/Ni)n, (CoNi/Pt)n, (CoCr/Pt)n, or (CoCr/Pd)n, where the subscript n denotes the stacking number.

In summary, each of the magnetic layers constituting the magnetic tunnel junction MTJ can be classified in various manners, according to its position, function and origin of perpendicularity in magnetization direction, as exemplarily shown in FIG. 13. FIGS. 14 through 21 are sectional views exemplarily showing the lower or upper structure 41 or 42 including a magnetic layer according to this classification.

Referring to FIG. 13, according to positional classification, each of the magnetic layers in the magnetic tunnel junction MTJ may be a magnetic layer 210 or 215 for the lower structure 41, as shown in FIGS. 14 through 17, or a magnetic layer 310 or 315 for the upper structure 42, as shown in FIGS. 18 through 21. That is, the lower structure 41 may be one of first to fourth lower structures 201, 202, 203 and 204 shown in FIGS. 14 through 17, and the upper structure 42 may be one of first to fourth upper structures 301, 302, 303 and 304 shown in FIGS. 18 through 21.

In addition, according to functional classification, the magnetic layer 210, 215, 310 and 315 may be used as the free layer FRL having a switchable magnetization property, as exemplarily illustrated in FIGS. 14, 16, 18 and 20, or as the pinned layer PL having a fixed magnetization property, as exemplarily illustrated in FIGS. 15, 17, 19 and 21. That is, the first and third lower structures 201 and 203 and the first and third upper structures 301 and 303 may be configured to include the free layer FRL, and the second and fourth lower structures 202 and 204 and the second and fourth upper structures 302 and 304 may be configured to include the pinned layer PL.

Referring to FIGS. 15, 17, 19 and 21, in the case that the magnetic layer 210, 215, 310 or 315 is used as the pinned layer PL, the lower or upper structures 41 or 42 may further include a pinning layer 240 or 340 fixing the magnetization direction of the magnetic layer 210, 215, 310 or 315. That is, the second and fourth lower structures 202 and 204 and the second and fourth upper structures 302 and 304 may further include the pinning layer 240 or 340.

According to some example embodiments, the pinning layer 240 or 340 may be configured to have a synthetic anti-ferromagnetic (SAF) structure. For example, the pinning layer 240 or 340 may be configured to include a pair of the intrinsic horizontal magnetic layers and an exchange coupling layer interposed therebetween. The exchange coupling layer may be formed of one of noble metals.

Figure 15:
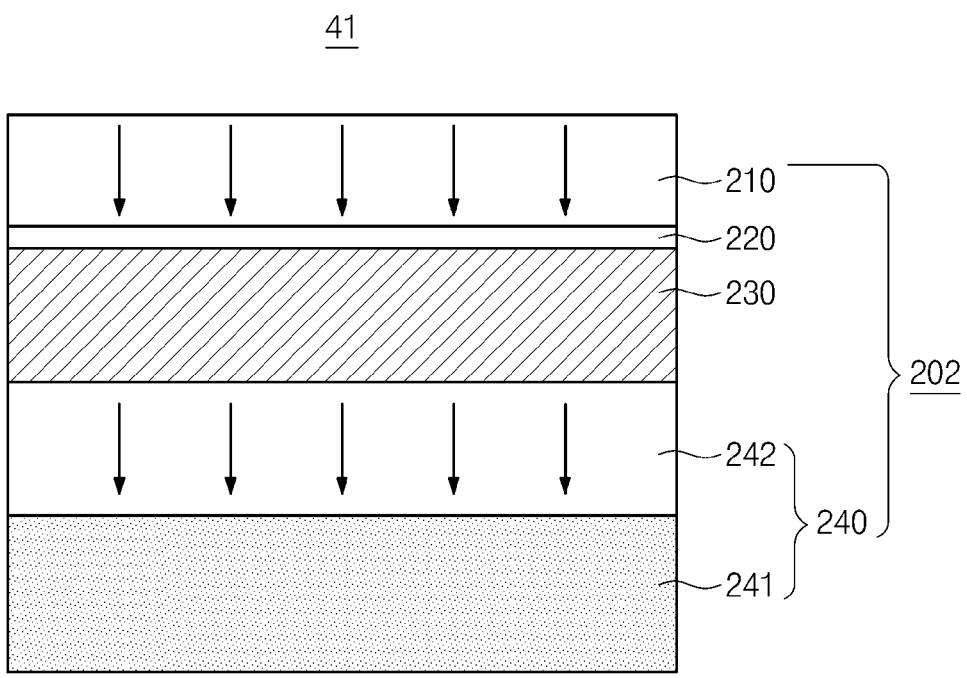
Figure 19:
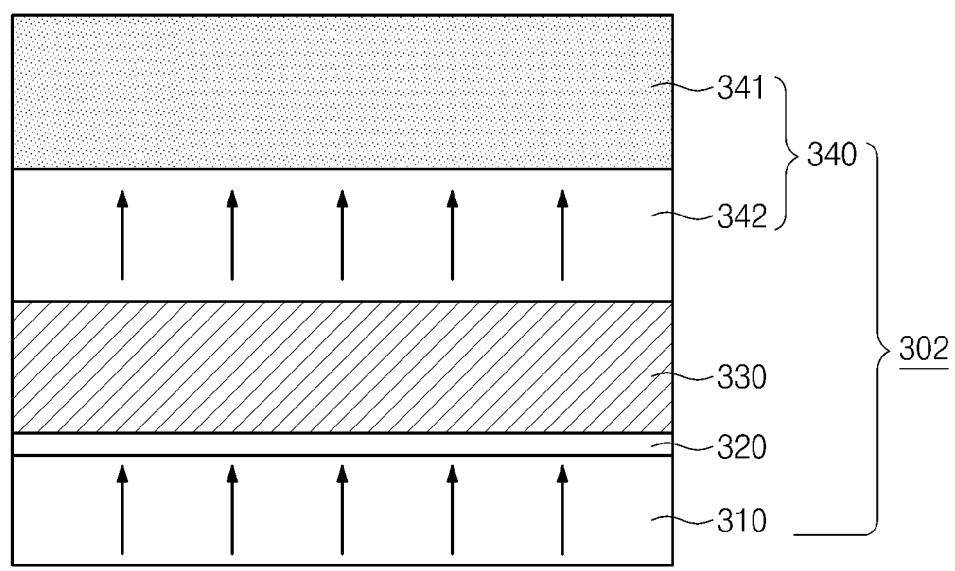

According to other example embodiments, as exemplarily shown in FIGS. 15 and 19, the pinning layer 240 or 340 may be configured to have a multi-layered structure including a first pinning layer 241 or 341 and a second pinning layer 242 or 342. In some example embodiments, the first pinning layer 241 or 341 may be configured to have the afore-mentioned SAF structure, and the second pinning layer 242 or 342 may be the afore-described IPM layer.

Referring back to FIG. 13, according to classification based on the origin of the perpendicular magnetization, the magnetic layer serving as the free layer FRL or the pinned layer PL may be an extrinsic perpendicular magnetic (EPM) layer 210 or 310, whose perpendicular magnetization has its origin in an external factor, or an IPM layer 215 or 315, whose perpendicular magnetization has its origin in an internal factor. The EPM layer 210 or 310 may be formed to be in direct contact with a perpendicular magnetization inducing (PMI) layer 220 or 320 causing the perpendicular magnetization thereof, as shown in FIGS. 14, 15, 18 and 19. The PMI layer 220 or 320 may be configured to have the same technical features as the perpendicular magnetization inducing layer PMI described with reference to FIG. 9. Accordingly, the EPM layer 210 or 310 and the PMI layer 220 or 320 may constitute the extrinsic perpendicular magnetization structure EPMS described with reference to FIG. 9.

Figure 14:
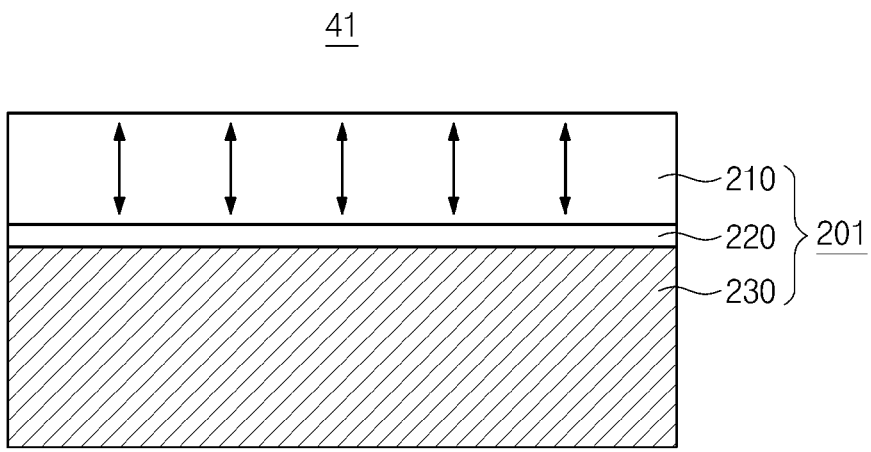
FIGS. 14 through 17 are sectional views of the lower structures according to example embodiments of inventive concepts.
Figure 18:
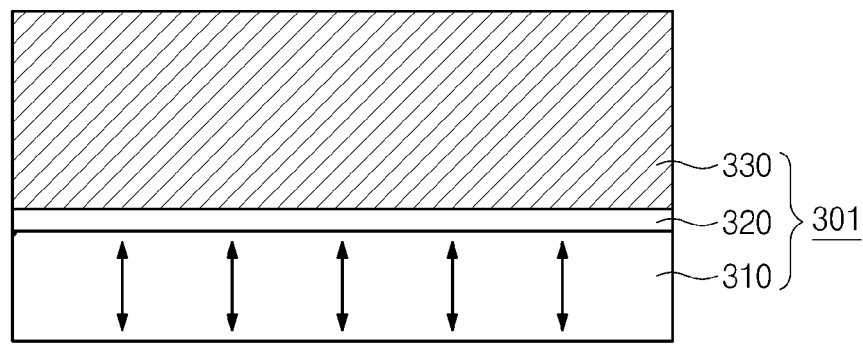
FIGS. 18 through 21 are sectional views of the upper structures according to example embodiments of inventive concepts.

In example embodiments where the magnetic layer is used as the EPM layer 210 of the lower structure 41, a perpendicular magnetization preserving (PMP) layer 230 may be disposed below the EPM layer 210 and the PMI layer 220 may be interposed between the PMP layer 230 and the EPM layer 210, as shown in FIGS. 14 and 15. That is, the PMI layer 220 and the EPM layer 210 may be sequentially stacked on the PMP layer 230. Furthermore, in the case that the magnetic layer is uses as the EPM layer 310 of the upper structure 42, a PMP layer 330 may be disposed on the EPM layer 310 and the PMI layer 320 may be interposed between the EPM layer 310 and the PMP layer 330 as shown in FIGS. 18 and 19. That is, the PMI layer 320 and the PMP layer 330 may be sequentially stacked on the EPM layer 310.

The PMP layer 230 and 330 may be formed of a material hardly reacting with oxygen atoms. For example, the PMP layer 230 and 330 may be a material, whose oxygen affinity is lower than metal atoms contained in the perpendicular magnetization inducing layer PMI. In some example embodiments, the PMP layer 230 and 330 may be formed of a material having the standard enthalpy of reaction of −300 or less [kJ/mole Oxygen] and the perpendicular magnetization inducing layer PMI may be a compound containing metal atoms whose standard enthalpy of reaction is −300 or more [kJ/mole Oxygen].

Accordingly, the PMP layer 230 or 330, the EPM layer 210 or 310, and the PMI layer 220 or 320 may constitute the extrinsic perpendicular magnetization structure EPMS described with reference to FIG. 9. In some example embodiments, the PMP layer 230 and 330 may be formed of at least one of noble metals or copper.

As exemplarily shown in FIGS. 15 and 19, in the case that the pinning layers 240 and 340 include the second pinning layers 242 and 342, respectively, the second pinning layers 242 and 342 may be more adjacent to the PMP layers 230 and 330, respectively, compared with the first pinning layer 241 and 341. In these example embodiments, the PMP layer 230 or 330 may be formed of at least one of materials allowing an exchange coupling between the EPM layer 210 or 310 and the second pinning layer 242 or 342. In some example embodiments, the EPM layer 210 and 310 may be configured to have parallel or antiparallel magnetization direction with respect to the second pinning layer 242 and 342, respectively.

The exchange coupling may be realized using some of the noble metals that are exemplarily mentioned as a material for the PMP layers 230 and 330. For example, the PMP layer 230 or 330 may include at least one of ruthenium (Ru), iridium (Ir), or rhodium (Rh). In other embodiments, the PMP layer 230 and 330 may be formed of at least one of non-magnetic metals, such as, titanium (Ti), tantalum (Ta), or magnesium (Mg), oxides thereof, or nitrides thereof.

Figure 16:
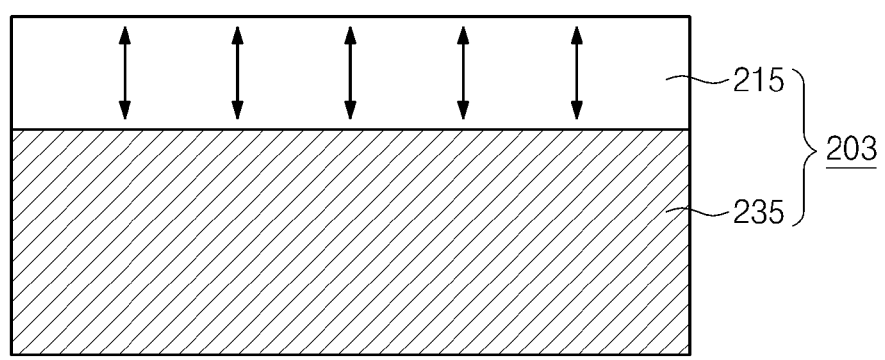
Figure 17:
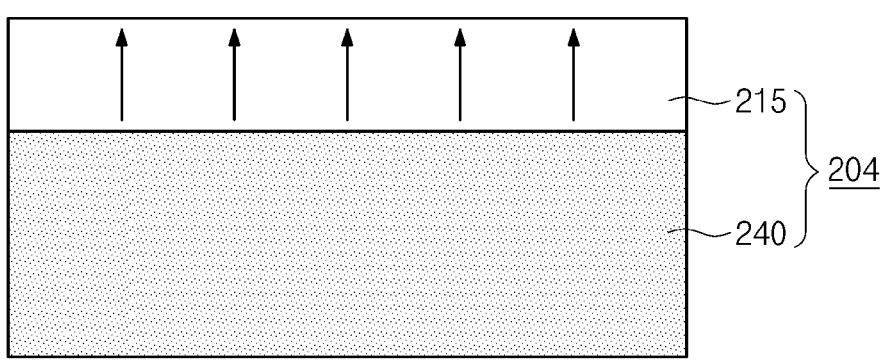
Figure 20:
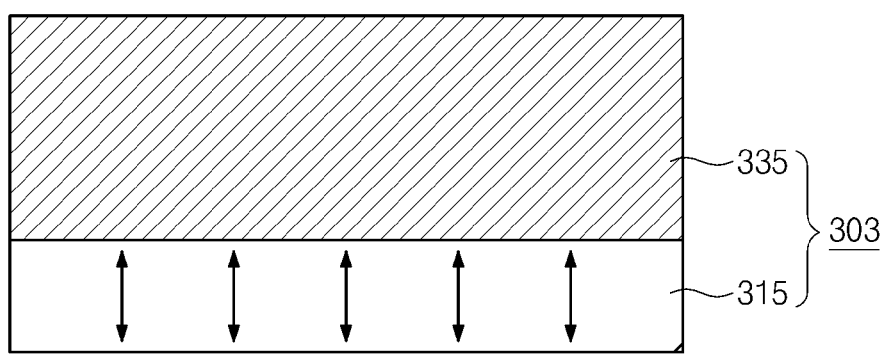
Figure 21:
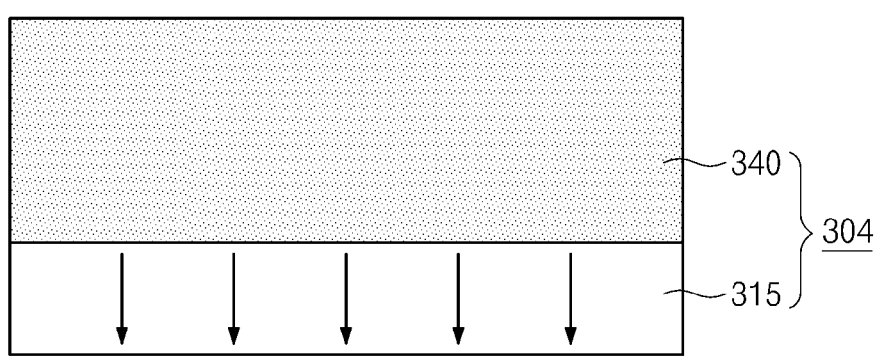

As shown in FIGS. 16 and 20, the magnetic layer may be uses as the IPM layer 215 or 315 in aspects of its origin of perpendicularity and as the free layer FRL in aspects of its function. According to these example embodiments, a lower layer 235 may be disposed below the IPM layer 215 or an upper layer 335 may be disposed on the IPM layer 315. The lower layer 235 and the upper layer 335 may be formed of at least one of metals. For example, the upper layer 335 and the lower layer 235 may include at least one of ruthenium (Ru), tantalum (Ta), palladium (Pd), titanium (Ti), platinum (Pt), silver (Ag), gold (Au), or copper (Cu).

In some example embodiments, the lower layer 235 may serve as a seed layer for growing the IPM layer 215 thereon. For instance, in the case that the IPM layer 215 is formed of a material with L10 structure, the lower layer 235 may include a conductive metal nitride layer with the sodium chloride crystal structure (e.g., of titanium nitride, tantalum nitride, chromium nitride, or vanadium nitride). The upper layer 335 may serve as a capping layer for protecting the IPM layer 315 thereunder.

The first to fourth lower structures 201, 202, 203 and 204 and the first to fourth upper structures 301, 302, 303 and 304 may be used to realize the magnetic tunnel junction MTJ according to example embodiments of inventive concepts described with reference to FIG. 1. In example embodiments, the magnetic tunnel junction MTJ may include the lower structure 41, the tunnel barrier 50, and the upper structure 42, which are sequentially stacked, as described with reference to FIG. 1, and be the first type of magnetic tunnel junction MTJ1 described with reference to FIG. 7 or the second type of magnetic tunnel junction MTJ2 described with reference to FIG. 8.

Figure 23:
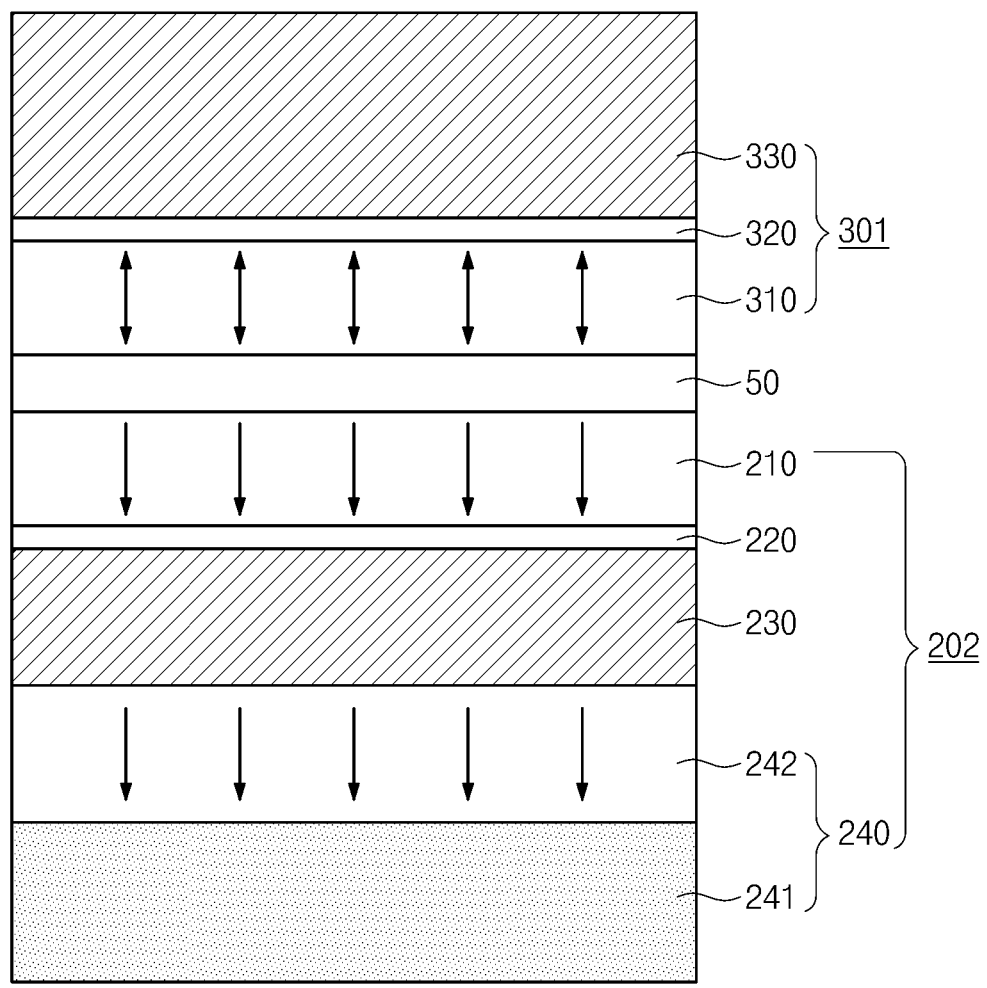
FIGS. 23 through 25 are sectional views exemplarily illustrating the first type of MTJ according to example embodiments of inventive concepts.
Figure 24:
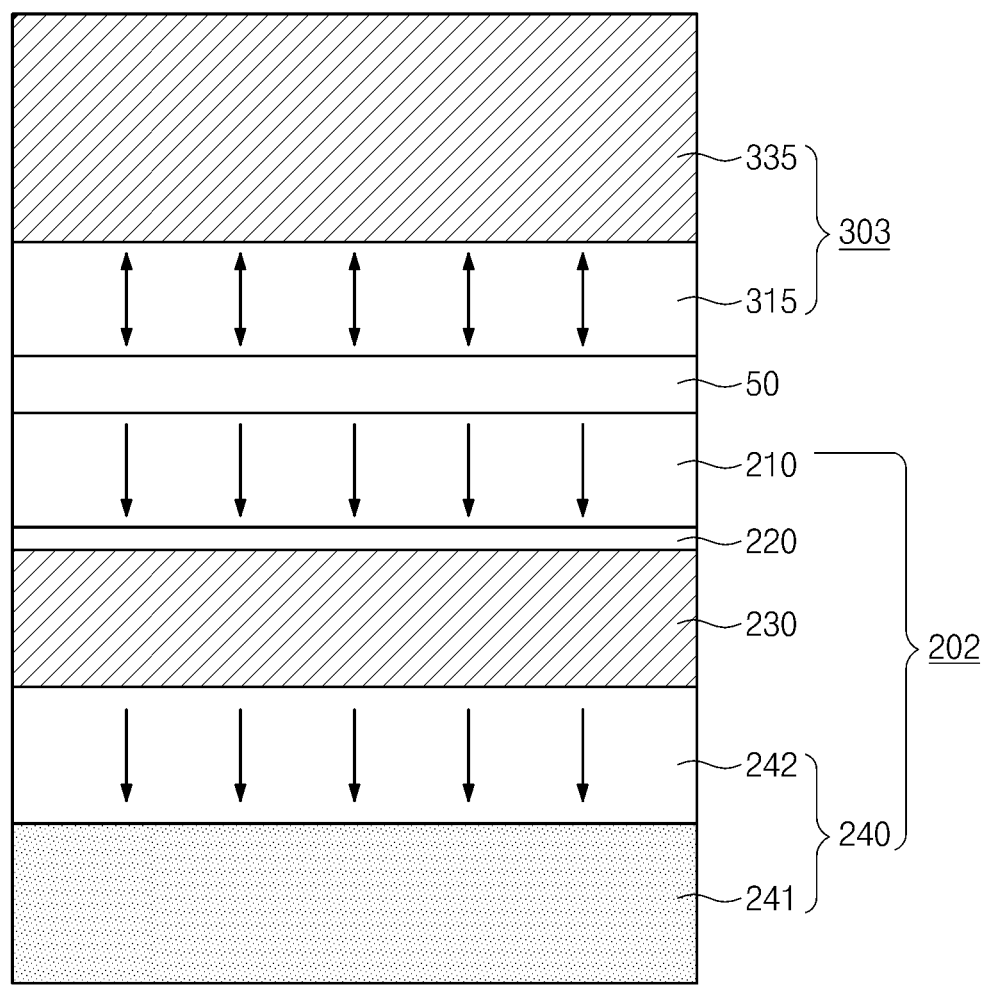
Figure 25:
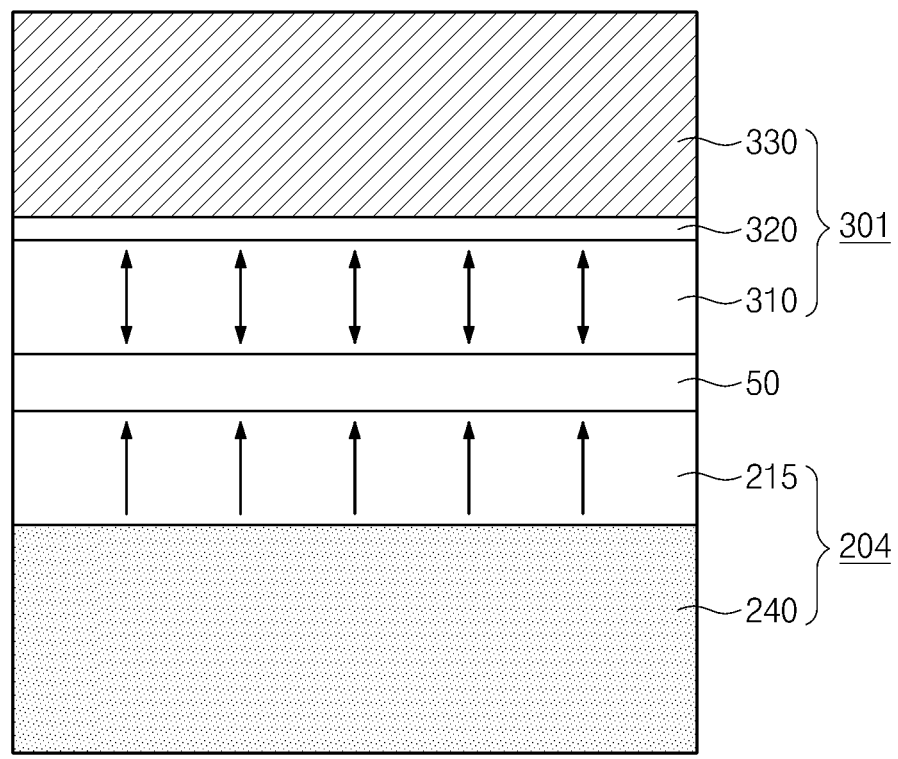

In other words, as shown in FIG. 22, the first type of magnetic tunnel junction MTJ1 may be configured to have the lower structure 41 including the pinned layer PL and the upper structure 42 including the free layer FRL. The lower structure 41 including the pinned layer PL may be the second lower structure 202 shown in FIGS. 23 and 24 or the fourth lower structure 204 shown in FIG. 25. The upper structure 42 including the free layer FRL may be the first upper structure 301 shown in FIGS. 23 and 25 or the third upper structure 303 shown in FIG. 24.

Figure 27:
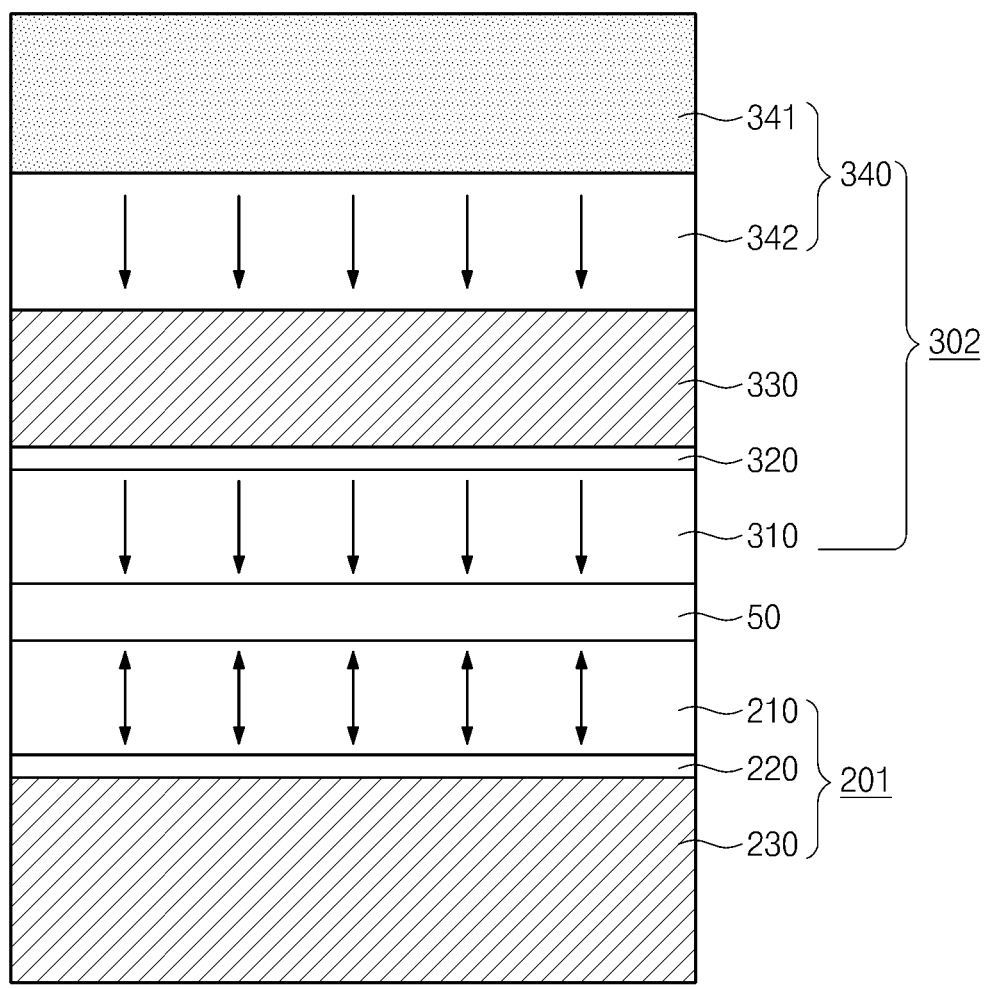
FIGS. 27 through 29 are sectional views exemplarily illustrating the second type of MTJ according to example embodiments of inventive concepts.
Figure 28:
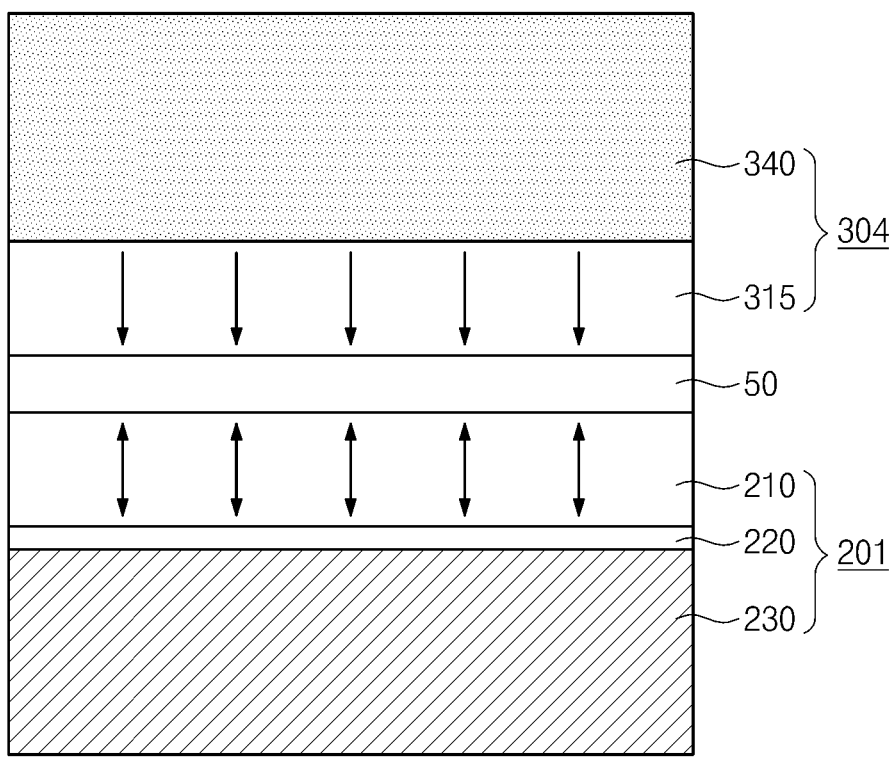
Figure 29:
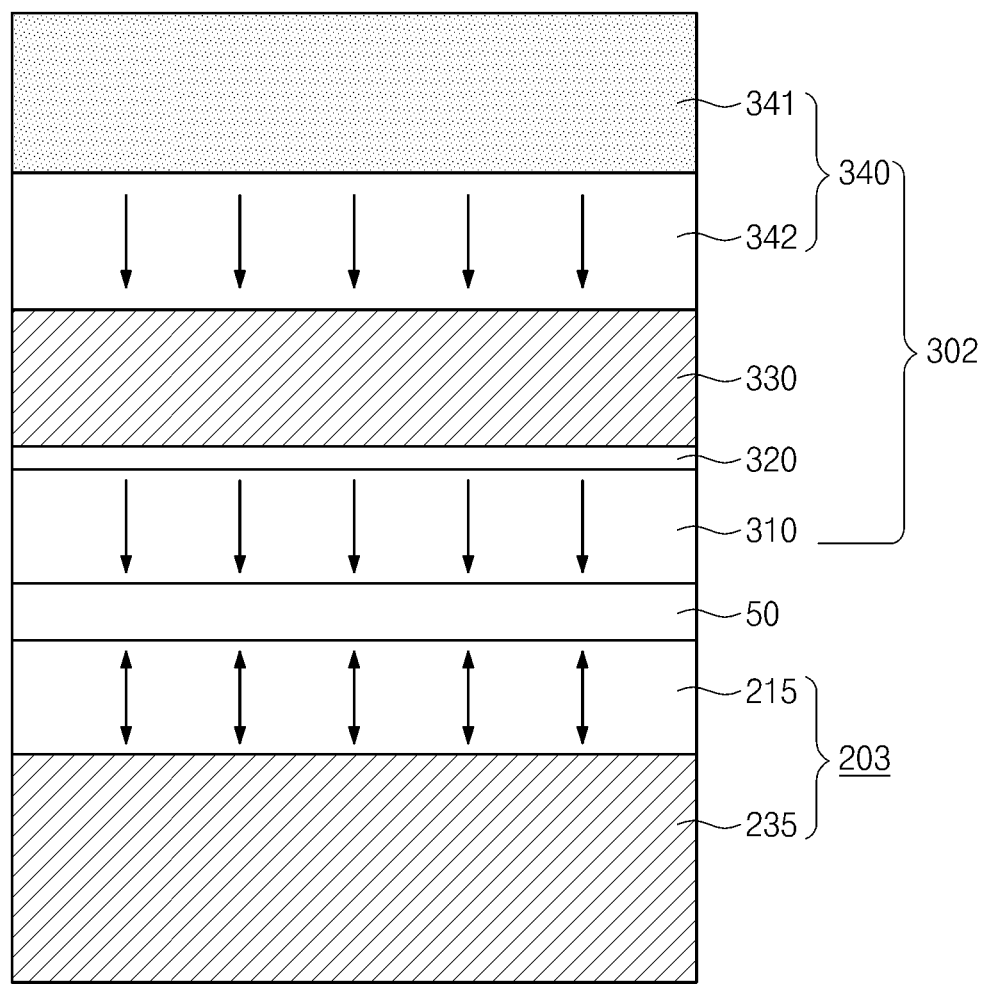

Alternatively, as shown in FIG. 26, the second type of magnetic tunnel junction MTJ2 may be configured to have the lower structure 41 including the free layer FRL and the upper structure 42 including the pinned layer PL. The lower structure 41 including the free layer FRL may be the first lower structure 201 shown in FIGS. 27 and 28 or the third lower structure 203 shown in FIG. 29. The upper structure 42 including the pinned layer PL maybe the second upper structure 302 shown in FIGS. 27 and 29 or the fourth upper structure 304 shown in FIG. 28.

Figure 30:
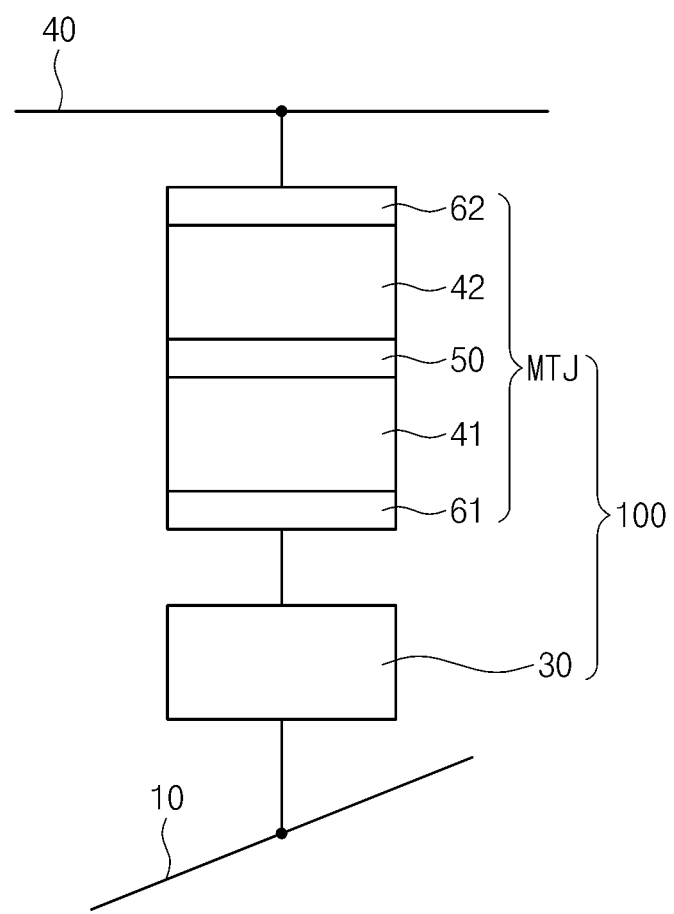
FIG. 30 is a schematic circuit diagram of a unit cell of a magnetic memory device according to modified embodiments of inventive concepts.

FIG. 30 is a schematic circuit diagram of a unit cell of a magnetic memory device according to modified example embodiments of inventive concepts.

Referring to FIG. 30, a magnetic tunnel junction MTJ according to the present embodiments may further include at least one of a lower electrode structure 61 disposed below the lower structure 41 and an upper electrode structure 62 disposed on the upper structure 42. The lower electrode structure 61 may be disposed between the first interconnection line 10 and the lower structure 41 or between the selection element 30 and the lower structure 41, and the upper electrode structure 62 may be disposed between the second interconnection line 20 and the upper structure 42.

In some example embodiments, at least one of the lower and upper electrode structures 61 and 62 may be configured to have a single-layered structure. In other example embodiments, at least one of the lower and upper electrode structures 61 and 62 may be configured to have a multi-layered structure. In addition, the lower and upper electrode structures 61 and 62 may include at least one conductive layer (e.g., of metal). For example, the conductive layer of the upper electrode structure 62 may be a third capping layer CL3, which will be described with reference to FIGS. 31 and 32, the conductive layer of the lower electrode structure 61 may be a first seed layer SL1, which will be described with reference to FIGS. 33 and 34. But example embodiments of inventive concepts need not be limited thereto; for instance, in other modified example embodiments, a magnetic tunnel junction MTJ may be configured not to include one of the lower and upper electrode structures 61 and 62.

Figure 31:
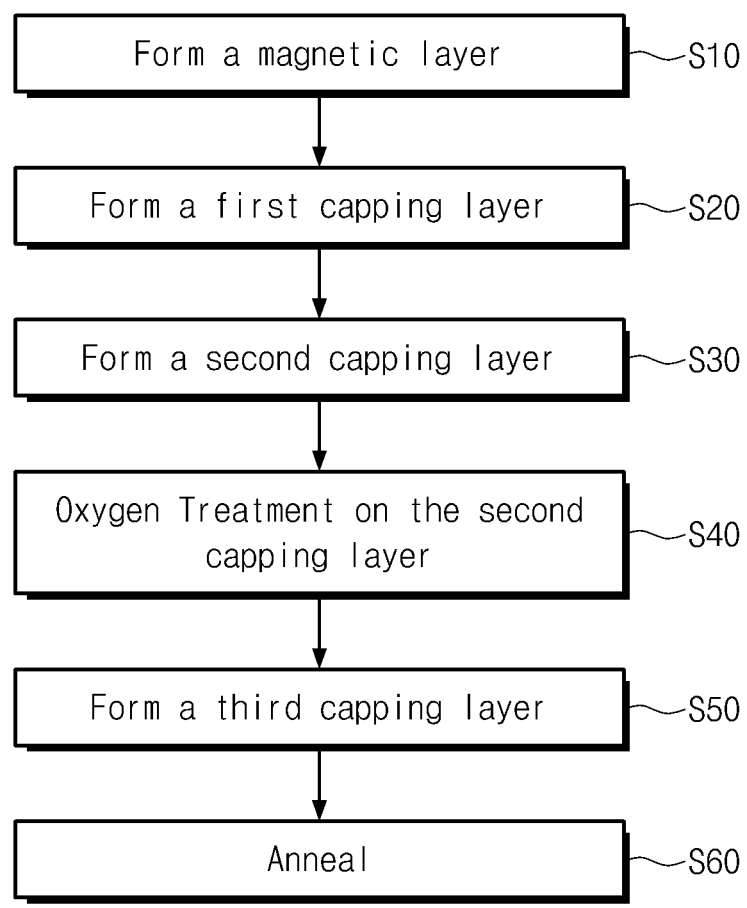
FIG. 31 is a flowchart exemplarily illustrating a method of fabricating a MTJ according to some example embodiments of inventive concepts.
Figure 32:
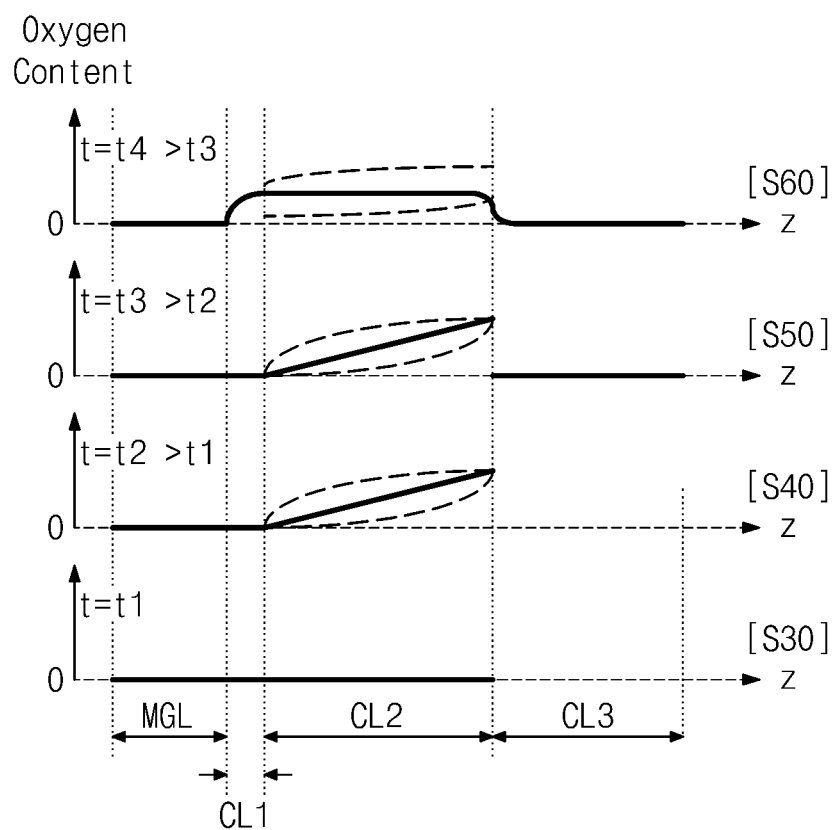
FIG. 32 is a graph illustrating some aspects of the MTJ fabricated by the method of FIG. 31.

FIG. 31 is a flowchart exemplarily illustrating a method of fabricating a MTJ according to some example embodiments of inventive concepts, and FIG. 32 is a graph illustrating some aspects of the MTJ fabricated by the method of FIG. 31. In example embodiments, FIG. 32 shows a temporal change in oxygen content in layers constituting the MTJ, and the horizontal and vertical axes represent the layer and the oxygen content, respectively. In order to reduce complexity in the drawings and to provide better understanding of example embodiments of inventive concepts, FIG. 32 shows together oxygen contents in some steps described with reference to FIG. 31.

Referring to FIGS. 31 and 32, a magnetic layer MGL may be formed (in S10). The magnetic layer MGL may be formed of a ferromagnetic material or the IPM layer.

Thereafter, a first capping layer CL1, for example, a perpendicular magnetization inducing layer PMI, and a second capping layer CL2, for example, a perpendicular magnetization preserving layer PMP, may be sequentially formed on the magnetic layer MGL (in S20 and S30). The first capping layer CL1 may be formed of a material having an oxygen affinity greater than the magnetic layer MGL and/or the second capping layer CL2. In some example embodiments, the first capping layer CL1 may be formed of at least one of magnesium, tantalum, titanium, aluminum, magnesium zinc, hafnium, or magnesium boron, and the second capping layer CL2 may be formed of at least one of noble metals (e.g., ruthenium (Ru), rhodium (Rh), palladium (Pd), silver (Ag), osmium (Os), iridium (Ir), platinum (Pt), or gold (Au)) or copper. In some example embodiments, the first capping layer CL1 may be formed to have a thickness one to three times greater than its single-layered thickness (e.g., a thickness of one atom or one molecule constituting the first capping layer CL1).

In some example embodiments, as shown in FIG. 32, the magnetic layer MGL, the first capping layer CL1, and the second capping layer CL2 may remain in a substantially oxygen-free state at this moment. Meanwhile, a wafer may be exposed by an external atmosphere containing oxygen atoms, during its transferring and/or waiting procedures to be performed outside a deposition chamber. Accordingly, an uppermost layer on the wafer may have a specific oxygen content (hereinafter, nature oxygen content) originated from diffusion of oxygen atoms. According to example embodiments of inventive concepts, at this moment, the magnetic layer MGL, the first capping layer CL1, and the second capping layer CL2 may have oxygen contents less than or equivalent to the nature oxygen content.

An oxygen treatment may be performed on the second capping layer CL2 (in S40). The oxygen treatment S40 may be performed to oxidize at least a portion of an exposed surface of the second capping layer CL2. For example, the oxygen treatment S40 may include supplying a gas containing oxygen at a temperature of 0 to 500 Celsius degree and a pressure of about 0.1 mT to about 1 T. In some example embodiments, the gas supplied in the oxygen treatment S40 may include at least one of oxygen and ozone gases.

As the result of the oxygen treatment S40, as shown in FIG. 32, the second capping layer CL2 may have an increased oxygen content, compared with the case of S30. For example, the oxidized portion of the second capping layer CL2 may be an oxygen-containing noble metal layer or an oxygen-containing copper layer. In some example embodiments, the oxygen content of the oxidized second capping layer CL2 may exhibit a decreasing trend from its exposed surface (e.g., a top surface) to the magnetic layer MGL, but example embodiments of inventive concepts need not be limited thereto. For example, the oxygen content in the second capping layer CL2 may exhibit a variety of spatial distributions, depending on process conditions in the oxygen treatment S40 and/or a material or structure of the second capping layer CL2.

In some example embodiments, after the oxygen treatment S40, the second capping layer CL2 may include a stoichiometric oxide layer. For example, the second capping layer CL2 may be a ruthenium layer before performing the oxygen treatment S40 but may include a ruthenium oxide layer after performing the oxygen treatment S40. In other example embodiments, after performing the oxygen treatment S40, the second capping layer CL2 may include a non-stoichiometric oxide layer. For example, the second capping layer CL2 may include at least a portion, whose oxygen content is greater or less than that of the stoichiometric oxide layer.

In still other example embodiments, after the oxygen treatment S40, oxygen atoms may be inhomogeneously distributed in the second capping layer CL2. That is, the second capping layer CL2 may include a first portion and a second portion having an oxygen content greater than the first portion. For example, as exemplarily shown in FIG. 32, the oxygen content of the oxidized second capping layer CL2 may exhibit a decreasing trend from its exposed surface (e.g., the top surface) to the magnetic layer MGL. Alternatively, after the oxygen treatment S40, oxygen atoms may be homogeneously distributed in the second capping layer CL2.

In some modified example embodiments, when the oxygen treatment S40 is not performed, the second capping layer CL2 may be a material having an oxygen affinity less than the first capping layer CL1 and an oxygen content greater than the first capping layer CL1. For example, the second capping layer CL2 may be formed to have an oxygen content substantially greater than the nature oxygen content. In example embodiments, the oxygen treatment S40 may be omitted.

In other modified example embodiments, when the oxygen treatment S40 is not performed, the first capping layer CL1 may be formed to have an oxygen content substantially greater than the nature oxygen content. For example, the formation of the first capping layer CL1 may include forming the first capping layer CL1 under an oxygen containing ambient.

In still other modified example embodiments, before the formation of the second capping layer CL2, an oxidation process may be performed to oxidize at least a portion of an exposed surface of the first capping layer CL1. In example embodiments, the oxygen treatment S40 may be omitted.

Referring back to FIG. 31, a third capping layer CL3, for example, a top or bottom electrode, or extra layer, may be formed after the oxygen treatment S40 (in S50). The third capping layer CL3 may be formed of a conductive material. In some example embodiments, the third capping layer CL3 may be formed of a conductive material having an oxygen affinity less than or equivalent to that of the second capping layer CL2, on which the oxygen treatment S40 is not yet performed, but example embodiments of inventive concepts need not be limited thereto. For example, in other embodiments, the third capping layer CL3 may be formed of a conductive material having an oxygen affinity greater than that of the second capping layer CL2, on which the oxygen treatment S40 is not yet performed.

A thermal treatment, for example, annealing, may be performed on the resultant structure provided with the third capping layer CL3 (in S60). In some example embodiments, the thermal treatment S60 may be performed at a temperature of 0 to 500 Celsius degree and a pressure of about 0.1 mT to about 1 T for a duration of about 1 sec to about 10000 sec. In some example embodiments, in the thermal treatment S60, at least one of nitrogen or inert gases may be supplied as an ambient gas. However, but example embodiments of inventive concepts need not be limited thereto. For example, process conditions for the thermal treatment S60 may be variously modified depending on materials, structures and oxygen contents of the first and second capping layers CL1 and CL2.

During the thermal treatment S60, oxygen atoms in the second capping layer CL2 may be downward diffused to oxidize metal atoms of the first capping layer CL1. For example, metal atoms of the first capping layer CL1 may react with the oxygen atoms, which are supplied from the second capping layer CL2 during the thermal treatment S60, and form a metal oxide layer. In some example embodiments, as shown in FIG. 32, an oxygen content of the first capping layer CL1 may be higher at a surface adjacent to the second capping layer CL2 than at a surface adjacent to the magnetic layer MGL. This difference in oxygen content may result from the fact that most oxygen atoms in the first capping layer CL1 are originated from the diffusion of the oxygen atoms in the second capping layer CL2.

In some modified example embodiments, the formation of the third capping layer CL3 may be omitted. For example, the thermal treatment S60 may be performed after or during the oxygen treatment S40. In other modified example embodiments, the formation of the third capping layer CL3 may be performed after the thermal treatment S60.

According to example embodiments described with reference to FIGS. 31 and 32, the magnetic layer MGL, the first capping layer CL1, and the second capping layer CL2 may serve as the magnetic layer MGL, the perpendicular magnetization inducing layer PMI, and the perpendicular magnetization preserving layer PMP, respectively, in extrinsic perpendicular magnetization structures EPMSs described above.

Figure 33:
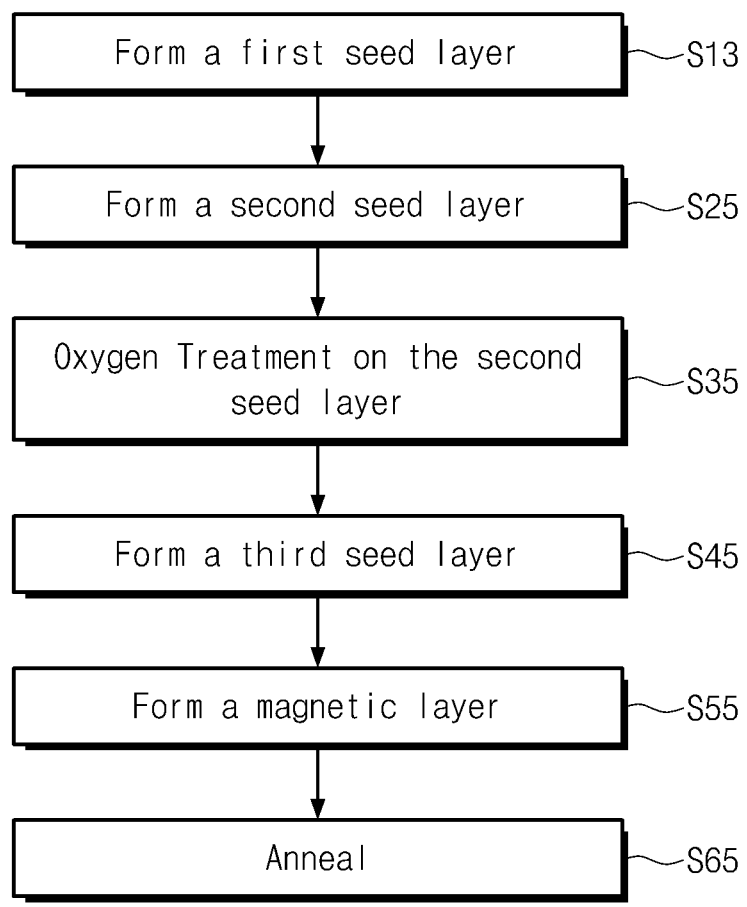
FIG. 33 is a flowchart exemplarily illustrating a method of fabricating a MTJ according to other example embodiments of inventive concepts.
Figure 34:
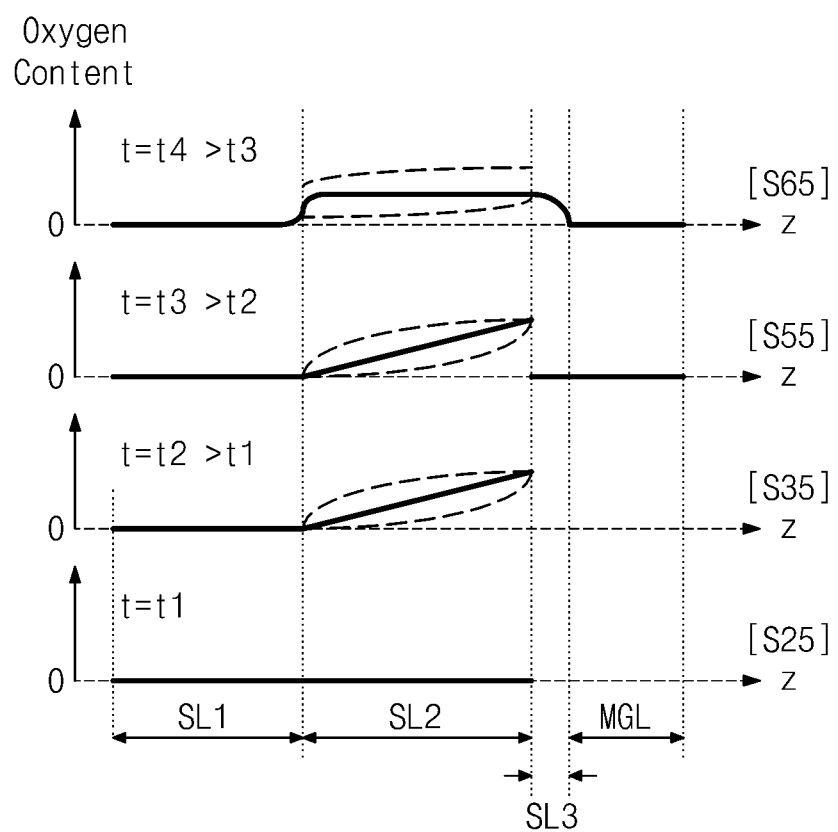
FIG. 34 is a graph illustrating some aspects of the MTJ fabricated by the method of FIG. 33.

FIG. 33 is a flowchart exemplarily illustrating a method of fabricating a MTJ according to other embodiments of inventive concepts, and FIG. 34 is a graph illustrating some aspects of the MTJ fabricated by the method of FIG. 33. In more detail, FIG. 34 shows a temporal change in oxygen content in layers constituting the MTJ, and the horizontal and vertical axes represent the layer and the oxygen content, respectively. In order to reduce complexity in the drawings and to provide better understanding of example embodiments of inventive concepts, FIG. 34 shows together oxygen contents in some steps described with reference to FIG. 33.

Referring to FIGS. 33 and 34, a first seed layer SL1, for example, a top or bottom electrode or an extra layer, and a second seed layer SL2, for example, a perpendicular magnetization preserving layer PMP, may be sequentially formed (in S15 and S25). The first seed layer SL1 may be formed of a conductive material, and the second seed layer SL2 may be formed of a material having an oxygen affinity less than tantalum. For example, the second seed layer SL2 may be formed of at least one of noble metals (e.g., ruthenium (Ru), rhodium (Rh), palladium (Pd), silver (Ag), osmium (Os), iridium (Ir), platinum (Pt), or gold (Au)) or copper. In some example embodiments, the first seed layer SL1 may be formed of a conductive material having an oxygen affinity less than or equivalent to the second seed layer SL2. But example embodiments of inventive concepts need not be limited thereto. For example, in other example embodiments, the first seed layer SL1 may be formed of a material having an oxygen affinity greater than the second seed layer SL2. In other example embodiments, the formation of the first seed layer SL1 may be omitted.

An oxygen treatment may be performed on the second seed layer SL2 (in S35). The oxygen treatment S35 may be performed to oxidize at least a portion of an exposed surface of the second seed layer SL2. For example, the oxygen treatment S35 may include supplying a gas containing oxygen at a temperature of 0 to 500 Celsius degree and/or a pressure of about 0.1 mT to about 1 T. In some example embodiments, the gas supplied in the oxygen treatment S35 may include at least one of oxygen and ozone gases.

As the result of the oxygen treatment S35, as shown in FIG. 34, the second seed layer SL2 may have an increased oxygen content, compared the case of S25. For example, the oxidized portion of the second seed layer SL2 may be an oxygen-containing noble metal layer or an oxygen-containing copper layer. In some example embodiments, the oxygen content of the oxidized second seed layer SL2 may exhibit a decreasing trend from its exposed surface (e.g., a top surface) to the first seed layer SL1, but example embodiments of inventive concepts need not be limited thereto. For example, the oxygen content in the second seed layer SL2 may exhibit a variety of spatial distributions, depending on process conditions in the oxygen treatment S35 and/or a material or structure of the second seed layer SL2.

In some example embodiments, after the oxygen treatment S35, the second seed layer SL2 may include a stoichiometric oxide layer. For example, the second seed layer SL2 may be a ruthenium layer before performing the oxygen treatment S35 but may include a ruthenium oxide layer after performing the oxygen treatment S35. In other example embodiments, after performing the oxygen treatment S35, the second seed layer SL2 may include a non-stoichiometric oxide layer. For example, after the oxygen treatment S35, the second seed layer SL2 may include at least a portion, whose oxygen content is greater or less than that of the stoichiometric oxide layer.

In still other example embodiments, after the oxygen treatment S35, oxygen atoms may be inhomogeneously distributed in the second seed layer SL2. That is, the second seed layer SL2 may include a first portion and a second portion having an oxygen content greater than the first portion. For example, as exemplarily shown in FIG. 34, the oxygen content of the oxidized second seed layer SL2 may exhibit a decreasing trend from its exposed surface (e.g., the top surface) to the first seed layer SL1. Alternatively, after the oxygen treatment S35, oxygen atoms may be substantially homogeneously distributed in the second seed layer SL2.

Referring back to FIG. 33, a third seed layer SL3, for example, a perpendicular magnetization inducing layer PMI, and a magnetic layer MGL may be sequentially formed after the oxygen treatment S35 (in S45 and S55). The third seed layer SL3 may be formed of a material having an oxygen affinity greater than the magnetic layer MGL and/or the second seed layer SL2. In some example embodiments, the magnetic layer MGL may be formed of a ferromagnetic material or the IPM layer, and the third seed layer SL3 may be formed of a metal layer an oxygen affinity greater than the second seed layer SL2. For example, the third seed layer SL3 may be formed of at least one of magnesium, tantalum, titanium, aluminum, magnesium zinc, hafnium, or magnesium boron. In some example embodiments, the third seed layer SL3 may be formed to have a thickness one to three times greater than its single-layered thickness (e.g., a thickness of one atom or one molecule constituting the third seed layer SL3).

In some example embodiments, when the oxygen treatment S35 is not performed, the second seed layer SL2 may be a material having an oxygen affinity less than the third seed layer SL3 and an oxygen content greater than the third seed layer SL3. For example, the second seed layer SL2 may be formed to have an oxygen content substantially greater than the nature oxygen content. In example embodiments, the oxygen treatment S35 may be omitted.

A thermal treatment may be performed on the resultant structure provided with the magnetic layer MGL (in S65). In some example embodiments, the thermal treatment S65 may be performed at a temperature of 0 to 500 Celsius degree and a pressure of about 0.1 mT to about 1 T for a duration of about 1 sec to about 10000 sec. In some example embodiments, in the thermal treatment S65, at least one of nitrogen or inert gases may be supplied as an ambient gas. Example embodiments of inventive concepts need not be limited thereto. For example, process conditions for the thermal treatment S65 may be variously modified depending on materials, structures and oxygen contents of the second and third seed layers SL2 and SL3. In modified example embodiments, the thermal treatment S65 may be performed between the formations of the magnetic layer MGL and the third seed layer SL3.

During the thermal treatment S65, oxygen atoms in the second seed layer SL2 may be upward diffused to oxidize metal atoms of the third seed layer SL3. For example, metal atoms of the third seed layer SL3 may react with the oxygen atoms, which are supplied from the second seed layer SL2 during the thermal treatment S65, and form a metal oxide layer. In some example embodiments, as shown in FIG. 34, an oxygen content of the third seed layer SL3 may be higher at a surface adjacent to the second seed layer SL2 than at a surface adjacent to the magnetic layer MGL. This difference in oxygen content may result from the fact that most oxygen atoms in the third seed layer SL3 are originated from the diffusion of the oxygen atoms in the second seed layer SL2.

According to example embodiments described with reference to FIGS. 33 and 34, the magnetic layer MGL, the third seed layer SL3, and the second seed layer SL2 may serve as the magnetic layer MGL, the perpendicular magnetization inducing layer PMI, and the perpendicular magnetization preserving layer PMP, respectively, in extrinsic perpendicular magnetization structures EPMSs described above.

Figure 35:
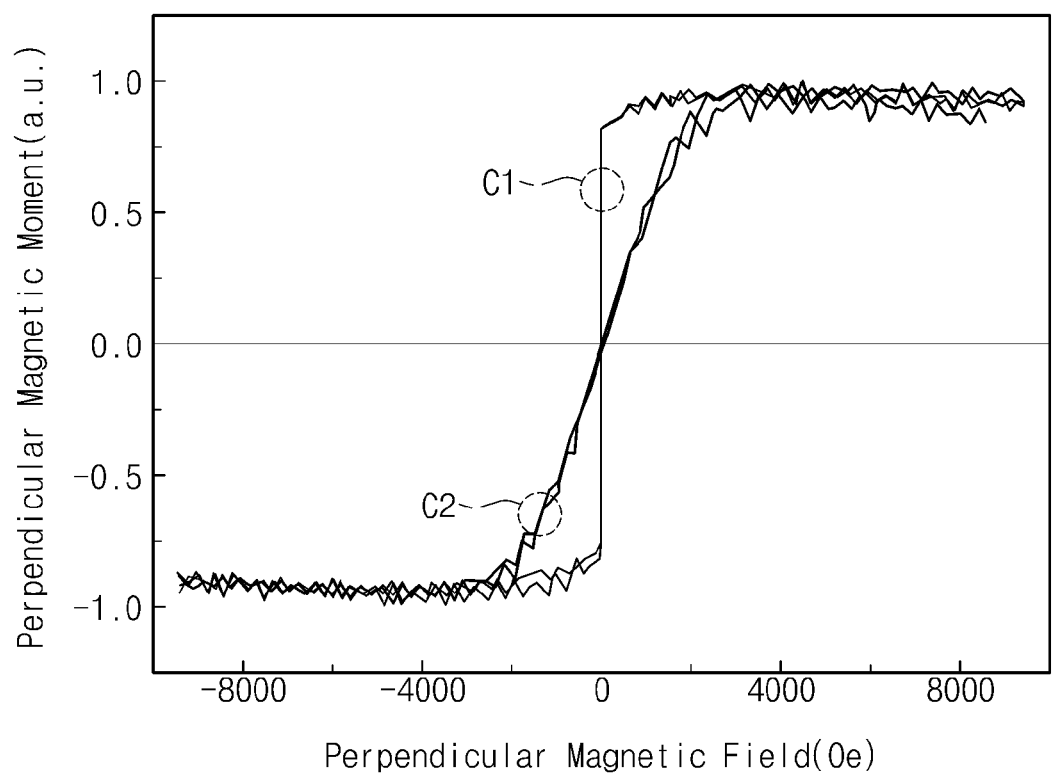
FIG. 35 is an experimental graph exemplarily showing some magnetic properties of MTJ according to example embodiments of inventive concepts.

FIG. 35 is an experimental graph exemplarily showing some magnetic properties of MTJ according to example embodiments of inventive concepts.

The experiment was performed on samples, in which the first upper structure 301 including the EPM, PMI, and PMP layers 310, 320 and 330 depicted in FIG. 18 was formed on the tunnel barrier 50 of magnesium oxide (MgO). For all samples, the EPM and PMI layers 310 and 320 were formed of CoFeB and MgO, respectively, while the PMP layer 330 was formed of titanium for some of the samples and of ruthenium for the others. In FIG. 35, curves C1 and C2 show results obtained from samples including the PMP layers 330 of Ru and Ti, respectively. The remaining conditions of the experiment were substantially the same.

In graph, the horizontal axis represents an intensity of externally applied perpendicular magnetic field and the vertical axis represents a perpendicular magnetic moment measured from the EPM layer 310.

Referring to FIG. 35, for samples depicted by the curve C1, there was no remarkable difference in perpendicular magnetic moment between cases applied with and without an external perpendicular magnetic field (e.g., at 0 Oe and at 4000 Oe). By contrast, for other samples depicted by the curve C2, the perpendicular magnetic moment was zero when an external perpendicular magnetic field was not applied. From this result, it can be said that the EPM layer 310 of Ru exhibits an improved perpendicular magnetic moment property, compared with the case of titanium.

Figure 36:
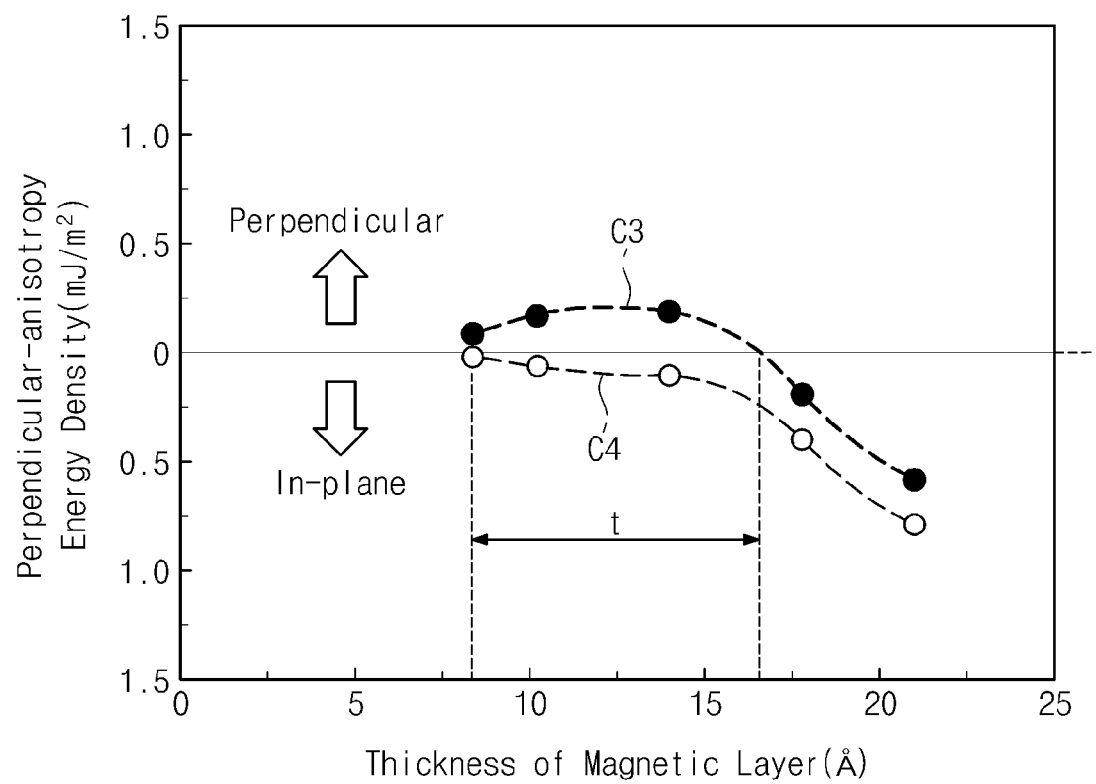
FIG. 36 is an experimental graph exemplarily showing other magnetic properties of MTJ according to example embodiments of inventive concepts.

FIG. 36 is an experimental graph exemplarily showing other magnetic properties of MTJ according to example embodiments of inventive concepts.

Two types of samples were tested. Samples of the first type were prepared to have the extrinsic perpendicular magnetization structure EPMS of FIG. 9 and other samples of the second type were prepared not to have the extrinsic perpendicular magnetization structure EPMS. In more detail, samples of the first type were fabricated to include layers of CoFeB, MgO, and Ru, which were sequentially stacked on a magnesium oxide layer provided as the tunnel barrier 50, and samples of the second type were fabricated to include layers of CoFeB and Ta, which were sequentially stacked on a magnesium oxide layer provided as the tunnel barrier 50.

In the experiment, from the samples of the first and second types, perpendicular anisotropy energy densities were measured with respect to a thickness of the magnetic layer (e.g., the CoFeB layer). In the graph of FIG. 36, horizontal and vertical axes represent a thickness and a perpendicular anisotropy energy density, respectively, of the magnetic layer, and curves C3 and C4 show results obtained from samples of the first and second types, respectively.

Referring to FIG. 36, the magnetic layer had positive perpendicular anisotropy energy densities, when it was formed to a thickness of 8, 10 or 14 angstroms, as depicted by the curve C3. That is, for the extrinsic perpendicular magnetization structure EPMS of FIG. 9 or the samples of the first type, the magnetic layer exhibited perpendicular anisotropy in a specific thickness range t of approximately 3 angstroms to approximately 17 angstroms. By contrast, as depicted by the curve C4, all samples of the second type had negative perpendicular anisotropy energy densities, irrespective of their thicknesses. That is, the magnetic layer of the second structure did not exhibit the perpendicular anisotropic property.

Figure 37:
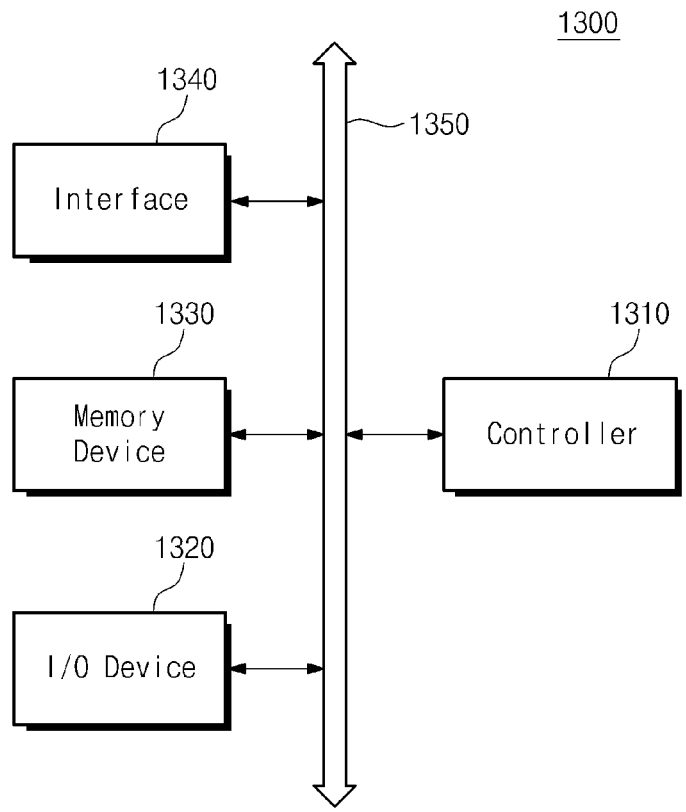
FIGS. 37 and 38 are schematic block diagrams schematically illustrating electronic devices including a semiconductor device according to example embodiments of inventive concepts.
Figure 38:
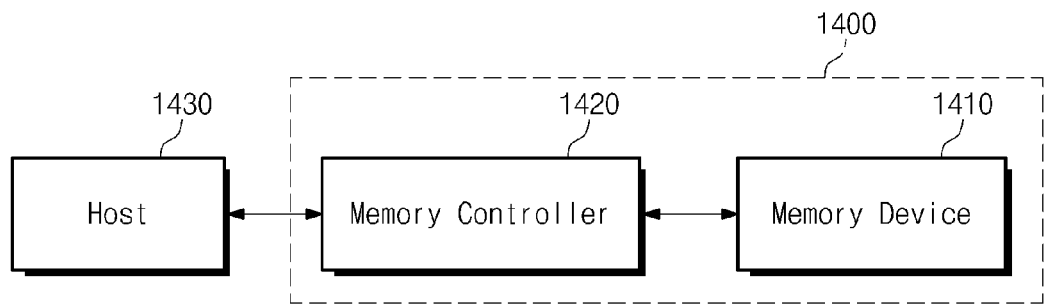

FIGS. 37 and 38 are block diagrams schematically illustrating electronic devices including a semiconductor device according to example embodiments of inventive concepts.

Referring to FIG. 37, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 38, a memory system including a semiconductor device according to example embodiments of inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

According to example embodiments of inventive concepts, a magnetic tunnel junction may be configured to include an extrinsic perpendicular magnetization structure having a magnetic layer, a perpendicular magnetization preserving layer, and a perpendicular magnetization inducing layer therebetween. The perpendicular magnetization preserving layer may be formed of a material having a low oxygen affinity, and this enables to prevent a perpendicular anisotropy in a magnetization direction of the magnetic layer from being deteriorated under the subsequent thermal environments.

While example embodiments of inventive concepts have been particularly shown and described, it will be understood by one of ordinary skill in the art that variations in form and detail may be made therein without departing from the spirit and scope of the attached claims.

What is claimed is:
1. A magnetic tunneling junction device comprising:
a fixed magnetic structure;
a free magnetic structure; and
a tunnel barrier between the fixed magnetic structure and the free magnetic structure,
at least one of the fixed magnetic structure and the free magnetic structure including
a perpendicular magnetization preserving layer,
a magnetic layer between the perpendicular magnetization preserving layer and the tunnel barrier, and
a perpendicular magnetization inducing layer between the perpendicular magnetization preserving layer and the magnetic layer.

2. The magnetic tunneling junction device of claim 1, wherein the magnetic layer is made of a ferromagnetic material.

3. The magnetic tunneling junction device of claim 2, wherein the ferromagnetic material is at least one of CoFeB, CoFe, NiFe, CoFePt, CoFePd, CoFeCr, CoFeTb, CoFeGd or CoFeNi.

4. The magnetic tunneling junction device of claim 1, wherein the magnetic layer has a thickness in a range of about 1 angstrom to about 30 angstroms.

5. The magnetic tunneling junction device of claim 4, wherein the magnetic layer has a thickness in a range of about 3 angstroms to about 17 angstroms.

6. The magnetic tunneling junction device of claim 1, wherein the perpendicular magnetization inducing layer is in direct contact with the magnetic layer.

7. The magnetic tunneling junction device of claim 1, wherein the perpendicular magnetization inducing layer includes at least one of Ta, Ti, U, Ba, Zr, Al, Sr, Hf, La, Ce, Sm, Mg, Th, Ca, Sc, or Y.

8. The magnetic tunneling junction device of claim 1, wherein the perpendicular magnetization inducing layer has an electrical resistivity higher than the magnetic layer or the perpendicular magnetization preserving layer.

9. The magnetic tunneling junction device of claim 1, wherein the perpendicular magnetization inducing layer has a thickness less than the magnetic layer or the perpendicular magnetization preserving layer.

10. The magnetic tunneling junction device of claim 1, wherein the perpendicular magnetization preserving layer has an electrical resistivity lower than the perpendicular magnetization inducing layer.

11. The magnetic tunneling junction device of claim 1, wherein the perpendicular magnetization preserving layer is formed of at least one noble metal or copper.

12. The magnetic tunneling junction device of claim 11, wherein the at least one noble metal includes ruthenium (Ru), rhodium (Rh), palladium (Pd), silver (Ag), osmium (Os), iridium (Ir), platinum (Pt), or gold (Au).

13. The magnetic tunneling junction device of claim 1, further comprising;
a substrate;
wherein the fixed magnetic structure is a lower structure closer to the substrate and the wherein the free magnetic structure is an upper structure further from the substrate.

14. The magnetic tunneling junction device of claim 1, further comprising;
a substrate;
wherein the free magnetic structure is a lower structure closer to the substrate and the wherein the fixed magnetic structure is an upper structure further from the substrate.

15. An electronic device, comprising:
a bus;
a wireless interface configured to transmit data to or receive data from a wireless communication network connected to the bus;
an I/O device connected to the bus;
a controller connected to the bus; and
a memory including a semiconductor device including the magnetic tunneling junction device of claim 1, connected to the bus, configured to store a command code to be used by the controller or user data.

16. A memory system, comprising:
a memory device including a semiconductor device including the magnetic tunneling junction device of claim 1, for storing data; and
a memory controller configured to control the memory device to read data stored in the memory device or to write data into the memory device in response to a read/write request of a host.

* * * * *